United States Patent
Lin et al.

(10) Patent No.: US 7,901,993 B2
(45) Date of Patent: Mar. 8, 2011

(54) METHOD OF MAKING A SEMICONDUCTOR CHIP ASSEMBLY WITH AN ALUMINUM POST/BASE HEAT SPREADER AND A SILVER/COPPER CONDUCTIVE TRACE

(75) Inventors: Charles W. C. Lin, Singapore (SG); Chia-Chung Wang, Hsinchu (TW)

(73) Assignee: Bridge Semiconductor Corporation, Taipei (TW)

( * ) Notice: Subject to any disclaimer, the term of this patent is extended or adjusted under 35 U.S.C. 154(b) by 0 days.

(21) Appl. No.: 12/722,526

(22) Filed: Mar. 12, 2010

(65) Prior Publication Data

US 2010/0167438 A1  Jul. 1, 2010

Related U.S. Application Data

(60) Division of application No. 12/721,551, filed on Mar. 10, 2010, which is a continuation-in-part of application No. 12/616,773, filed on Nov. 11, 2009, and a continuation-in-part of application No. 12/616,775, filed on Nov. 11, 2009, said application No. 12/616,773 is a continuation-in-part of application No. 12/557,540, filed on Sep. 11, 2009, which is a continuation-in-part of application No. 12/557,541, filed on Sep. 11, 2009, which is a continuation-in-part of application No. 12/406,510, filed on Mar. 18, 2009, said application No. 12/616,775 is a continuation-in-part of application No. 12/557,540, filed on Sep. 11, 2009, which is a continuation-in-part of application No. 12/406,510, filed on Mar. 18, 2009, which is a continuation-in-part of application No. 12/554,541, filed on Sep. 4, 2009.

(60) Provisional application No. 61/071,589, filed on May 7, 2008, provisional application No. 61/071,588, filed on May 7, 2008, provisional application No. 61/071,072, filed on Apr. 11, 2008, provisional application No. 61/064,748, filed on Mar. 25, 2008, provisional application No. 61/150,980, filed on Feb. 9, 2009.

(51) Int. Cl.
  *H01L 21/44* (2006.01)
  *H01L 21/48* (2006.01)
(52) U.S. Cl. ........... 438/118; 438/26; 438/121; 438/122; 257/E21.499
(58) Field of Classification Search .................. 438/26, 438/118, 121, 122
See application file for complete search history.

(56) References Cited

U.S. PATENT DOCUMENTS 5,457,605 A  10/1995  Wagner et al. .............. 361/720

(Continued)

FOREIGN PATENT DOCUMENTS

JP  2005-166775  6/2005

*Primary Examiner* — Alexander G Ghyka
(74) *Attorney, Agent, or Firm* — David M. Sigmond

(57) ABSTRACT

A method of making a semiconductor chip assembly includes providing a post and a base, mounting an adhesive on the base including inserting the post into an opening in the adhesive, mounting a copper layer on the adhesive including aligning the post with an aperture in the copper layer, then flowing the adhesive into and upward in a gap located in the aperture between the post and the copper layer, solidifying the adhesive, then providing a conductive trace that includes a pad, a terminal, a silver coating and a copper core that is a selected portion of the copper layer, mounting a semiconductor device on the post, wherein an aluminum heat spreader includes the post and the base, electrically connecting the semiconductor device to the conductive trace and thermally connecting the semiconductor device to the heat spreader.

35 Claims, 21 Drawing Sheets

U.S. PATENT DOCUMENTS

| | | | |
|---|---|---|---|
| 6,507,102 B2 | 1/2003 | Juskey et al. | 257/406 |
| 6,528,882 B2 | 3/2003 | Ding et al. | 257/738 |
| 6,541,832 B2 | 4/2003 | Coyle | 257/415 |
| 6,670,219 B2 | 12/2003 | Lee et al. | 438/107 |
| 6,683,795 B1 | 1/2004 | Yoo | 361/816 |
| 6,900,535 B2 | 5/2005 | Zhou | 257/707 |
| 6,906,414 B2 | 6/2005 | Zhao et al. | 257/707 |
| 6,964,877 B2 | 11/2005 | Chen et al. | 438/20 |
| 7,038,311 B2 | 5/2006 | Woodall et al. | 257/706 |
| 2006/0054915 A1 | 3/2006 | Chang | 257/100 |
| 2006/0131735 A1 | 6/2006 | Ong et al. | 257/706 |
| 2007/0063213 A1 | 3/2007 | Hsieh et al. | 257/99 |
| 2007/0267642 A1 | 11/2007 | Erchak et al. | 257/98 |
| 2007/0290322 A1* | 12/2007 | Zhao et al. | 257/690 |
| 2010/0149756 A1* | 6/2010 | Rowcliffe et al. | 361/714 |
| 2010/0163921 A1* | 7/2010 | Lin et al. | 257/99 |
| 2010/0203679 A1* | 8/2010 | Lin et al. | 438/118 |
| 2010/0210049 A1* | 8/2010 | Lin et al. | 438/26 |
| 2010/0289054 A1* | 11/2010 | Lin et al. | 257/99 |

* cited by examiner

METHOD OF MAKING A SEMICONDUCTOR CHIP ASSEMBLY WITH AN ALUMINUM POST/BASE HEAT SPREADER AND A SILVER/COPPER CONDUCTIVE TRACE

CROSS-REFERENCE TO RELATED APPLICATIONS

This application is a divisional of U.S. application Ser. No. 12/721,551 filed Mar. 10, 2010, which is a continuation-in-part of U.S. application Ser. No. 12/616,773 filed Nov. 11, 2009, which is incorporated by reference. U.S. application Ser. No. 12/721,551 filed Mar. 10, 2010 is also a continuation-in-part of U.S. application Ser. No. 12/616,775 filed Nov. 11, 2009, which is incorporated by reference.

U.S. application Ser. No. 12/616,773 filed Nov. 11, 2009 and U.S. application Ser. No. 12/616,775 filed Nov. 11, 2009 are each a continuation-in-part of U.S. application Ser. No. 12/557,540 filed Sep. 11, 2009 and a continuation-in-part of U.S. application Ser. No. 12/557,541 filed Sep. 11, 2009.

U.S. application Ser. No. 12/557,540 filed Sep. 11, 2009 and U.S. application Ser. No. 12/557,541 filed Sep. 11, 2009 are each a continuation-in-part of U.S. application Ser. No. 12/406,510 filed Mar. 18, 2009, which claims the benefit of U.S. Provisional Application Ser. No. 61/071,589 filed May 7, 2008, U.S. Provisional Application Ser. No. 61/071,588 filed May 7, 2008, U.S. Provisional Application Ser. No. 61/071,072 filed Apr. 11, 2008, and U.S. Provisional Application Ser. No. 61/064,748 filed Mar. 25, 2008, each of which is incorporated by reference. U.S. application Ser. No. 12/557,540 filed Sep. 11, 2009 and U.S. application Ser. No. 12/557,541 filed Sep. 11, 2009 also claim the benefit of U.S. Provisional Application Ser. No. 61/150,980 filed Feb. 9, 2009, which is incorporated by reference.

BACKGROUND OF THE INVENTION

1. Field of the Invention

The present invention relates to semiconductor chip assembly, and more particularly to a semiconductor chip assembly with a semiconductor device, a conductive trace, an adhesive and a heat spreader and its method of manufacture.

2. Description of the Related Art

Semiconductor devices such as packaged and unpackaged semiconductor chips have high voltage, high frequency and high performance applications that require substantial power to perform the specified functions. As the power increases, the semiconductor device generates more heat. Furthermore, the heat build-up is aggravated by higher packing density and smaller profile sizes which reduce the surface area to dissipate the heat.

Semiconductor devices are susceptible to performance degradation as well as short life span and immediate failure at high operating temperatures. The heat not only degrades the chip, but also imposes thermal stress on the chip and surrounding elements due to thermal expansion mismatch. As a result, the heat must be dissipated rapidly and efficiently from the chip to ensure effective and reliable operation. A high thermal conductivity path typically requires heat conduction and heat spreading to a much larger surface area than the chip or a die pad it is mounted on.

Light emitting diodes (LEDs) have recently become popular alternatives to incandescent, fluorescent and halogen light sources. LEDs provide energy efficient, cost effective, long term lighting for medical, military, signage, signal, aircraft, maritime, automotive, portable, commercial and residential applications. For instance, LEDs provide light sources for lamps, flashlights, headlights, flood lights, traffic lights and displays.

LEDs include high power chips that generate high light output and considerable heat. Unfortunately, LEDs exhibit color shifts and low light output as well as short lifetimes and immediate failure at high operating temperatures. Furthermore, LED light output and reliability are constrained by heat dissipation limits. LEDs underscore the critical need for providing high power chips with adequate heat dissipation.

LED packages usually include an LED chip, a submount, electrical contacts and a thermal contact. The submount is thermally connected to and mechanically supports the LED chip. The electrical contacts are electrically connected to the anode and cathode of the LED chip. The thermal contact is thermally connected to the LED chip by the submount but requires adequate heat dissipation by the underlying carrier to prevent the LED chip from overheating.

Packages and thermal boards for high power chips have been developed extensively in the industry with a wide variety of designs and manufacturing techniques in attempts to meet performance demands in an extremely cost-competitive environment.

Plastic ball grid array (PBGA) packages have a chip and a laminated substrate enclosed in a plastic housing and are attached to a printed circuit board (PCB) by solder balls. The laminated substrate includes a dielectric layer that often includes fiberglass. The heat from the chip flows through the plastic and the dielectric layer to the solder balls and then the PCB. However, since the plastic and the dielectric layer typically have low thermal conductivity, the PBGA provides poor heat dissipation.

Quad-Flat-No Lead (QFN) packages have the chip mounted on a copper die pad which is soldered to the PCB. The heat from the chip flows through the die pad to the PCB. However, since the lead frame type interposer has limited routing capability, the QFN package cannot accommodate high input/output (I/O) chips or passive elements.

Thermal boards provide electrical routing, thermal management and mechanical support for semiconductor devices. Thermal boards usually include a substrate for signal routing, a heat spreader or heat sink for heat removal, pads for electrical connection to the semiconductor device and terminals for electrical connection to the next level assembly. The substrate can be a laminated structure with single layer or multi-layer routing circuitry and one or more dielectric layers. The heat spreader can be a metal base, a metal slug or an embedded metal layer.

Thermal boards interface with the next level assembly. For instance, the next level assembly can be a light fixture with a printed circuit board and a heat sink. In this instance, an LED package is mounted on the thermal board, the thermal board is mounted on the heat sink, the thermal board/heat sink subassembly and the printed circuit board are mounted in the light fixture and the thermal board is electrically connected to the printed circuit board by wires. The substrate routes electrical signals to the LED package from the printed circuit board and the heat spreader spreads and transfers heat from the LED package to the heat sink. The thermal board thus provides a critical thermal path for the LED chip.

U.S. Pat. No. 6,507,102 to Juskey et al. discloses an assembly in which a composite substrate with fiberglass and cured thermosetting resin includes a central opening, a heat slug with a square or rectangular shape resembling the central opening is attached to the substrate at sidewalls of the central opening, top and bottom conductive layers are attached to the top and bottom of the substrate and electrically connected to one another by plated through-holes through the substrate, a chip is mounted on the heat slug and wire bonded to the top conductive layer, an encapsulant is molded on the chip and solder balls are placed on the bottom conductive layer.

During manufacture, the substrate is initially a prepreg with B-stage resin placed on the bottom conductive layer, the heat slug is inserted into the central opening and on the bottom conductive layer and spaced from the substrate by a gap, the top conductive layer is mounted on the substrate, the conductive layers are heated and pressed towards one another so that the resin melts, flows into the gap and solidifies, the conductive layers are patterned to form circuit traces on the substrate and expose the excess resin flash on the heat slug, and the excess resin flash is removed to expose the heat slug. The chip is then mounted on the heat slug, wire bonded and encapsulated.

The heat flows from the chip through the heat slug to the PCB. However, manually dropping the heat slug into the central opening is prohibitively cumbersome and expensive for high volume manufacture. Furthermore, since the heat slug is difficult to accurately position in the central opening due to tight lateral placement tolerance, voids and inconsistent bond lines arise between the substrate and the heat slug. The substrate is therefore partially attached to the heat slug, fragile due to inadequate support by the heat slug and prone to delamination. In addition, the wet chemical etch that removes portions of the conductive layers to expose the excess resin flash also removes portions of the heat slug exposed by the excess resin flash. The heat slug is therefore non-planar and difficult to bond to. As a result, the assembly suffers from high yield loss, poor reliability and excessive cost.

U.S. Pat. No. 6,528,882 to Ding et al. discloses a thermal enhanced ball grid array package in which the substrate includes a metal core layer. The chip is mounted on a die pad region at the top surface of the metal core layer, an insulating layer is formed on the bottom surface of the metal core layer, blind vias extend through the insulating layer to the metal core layer, thermal balls fill the blind vias and solder balls are placed on the substrate and aligned with the thermal balls. The heat from the chip flows through the metal core layer to the thermal balls to the PCB. However, the insulating layer sandwiched between the metal core layer and the PCB limits the heat flow to the PCB.

U.S. Pat. No. 6,670,219 to Lee et al. discloses a cavity down ball grid array (CDBGA) package in which a ground plate with a central opening is mounted on a heat spreader to form a thermal dissipating substrate. A substrate with a central opening is mounted on the ground plate using an adhesive with a central opening. A chip is mounted on the heat spreader in a cavity defined by the central opening in the ground plate and solder balls are placed on the substrate. However, since the solder balls extend above the substrate, the heat spreader does not contact the PCB. As a result, the heat spreader releases the heat by thermal convection rather than thermal conduction which severely limits the heat dissipation.

U.S. Pat. No. 7,038,311 to Woodall et al. discloses a thermal enhanced BGA package in which a heat sink with an inverted T-like shape includes a pedestal and an expanded base, a substrate with a window opening is mounted on the expanded base, an adhesive attaches the pedestal and the expanded base to the substrate, a chip is mounted on the pedestal and wire bonded to the substrate, an encapsulant is molded on the chip and solder balls are placed on the substrate. The pedestal extends through the window opening, the substrate is supported by the expanded base and the solder balls are located between the expanded base and the perimeter of the substrate. The heat from the chip flows through the pedestal to the expanded base to the PCB. However, since the expanded base must leave room for the solder balls, the expanded base protrudes below the substrate only between the central window and the innermost solder ball. Consequently, the substrate is unbalanced and wobbles and warps during manufacture. This creates enormous difficulties with chip mounting, wire bonding and encapsulant molding. Furthermore, the expanded base may be bent by the encapsulant molding and may impede soldering the package to the next level assembly as the solder balls collapse. As a result, the package suffers from high yield loss, poor reliability and excessive cost.

U.S. Patent Application Publication No. 2007/0267642 to Erchak et al. discloses a light emitting device assembly in which a base with an inverted T-like shape includes a substrate, a protrusion and an insulative layer with an aperture, electrical contacts are mounted on the insulative layer, a package with an aperture and a transparent lid is mounted on the electrical contacts and an LED chip is mounted on the protrusion and wire bonded to the substrate. The protrusion is adjacent to the substrate and extends through the apertures in the insulative layer and the package into the package, the insulative layer is mounted on the substrate, the electrical contacts are mounted on the insulative layer and the package is mounted on the electrical contacts and spaced from the insulative layer. The heat from the chip flows through the protrusion to the substrate to a heat sink. However, the electrical contacts are difficult to mount on the insulating layer, difficult to electrically connect to the next level assembly and fail to provide multi-layer routing.

Conventional packages and thermal boards thus have major deficiencies. For instance, dielectrics with low thermal conductivity such as epoxy limit heat dissipation, whereas dielectrics with higher thermal conductivity such as epoxy filled with ceramic or silicon carbide have low adhesion and are prohibitively expensive for high volume manufacture. The dielectric may delaminate during manufacture or prematurely during operation due to the heat. The substrate may have single layer circuitry with limited routing capability or multi-layer circuitry with thick dielectric layers which reduce heat dissipation. The heat spreader may be inefficient, cumbersome or difficult to thermally connect to the next level assembly. The manufacturing process may be unsuitable for low cost, high volume manufacture.

Conventional heat spreaders are typically copper since copper has high thermal conductivity, good bondability and low cost. Aluminum is significantly lighter and less expensive that copper. However, aluminum is difficult to plate, solder and wire bond to since it oxidizes rapidly. Furthermore, aluminum has a higher coefficient of thermal expansion and lower structural integrity than copper. As a result, aluminum heat spreaders have not gained widespread acceptance.

In view of the various development stages and limitations in currently available packages and thermal boards for high power semiconductor devices, there is a need for a semiconductor chip assembly that is cost effective, reliable, manufacturable, versatile, provides flexible signal routing and has excellent heat spreading and dissipation.

SUMMARY OF THE INVENTION

The present invention provides a semiconductor chip assembly that includes a semiconductor device, a heat spreader, a conductive trace and an adhesive. The semiconductor device is electrically connected to the conductive trace and thermally connected to the heat spreader. The heat spreader is aluminum and includes a post and a base. The post extends upwardly from the base into an opening in the adhesive, and the base extends laterally from the post. The adhesive extends between the post and the conductive trace and between the base and the conductive trace. The conductive trace includes a silver coating and a copper core and provides signal routing between a pad and a terminal.

In accordance with an aspect of the present invention, a semiconductor chip assembly includes a semiconductor device, an adhesive, a heat spreader and a conductive trace. The adhesive includes an opening. The heat spreader is aluminum and includes a post and a base, wherein the post is adjacent to the base and extends above the base in an upward direction, and the base extends below the post in a downward direction opposite the upward direction and extends laterally from the post in lateral directions orthogonal to the upward and downward directions. The conductive trace includes a pad and a terminal as well as a silver coating and a copper core, and the silver coating is located above and overlaps the copper core.

The semiconductor device is above and overlaps the post, is electrically connected to the pad and thereby electrically connected to the terminal, and is thermally connected to the post and thereby thermally connected to the base. The adhesive is mounted on and extends above the base, extends between the post and the pad, extends laterally from the post to or beyond the terminal and is sandwiched between the base and the pad. The copper core is coplanar with the post and the adhesive at a lateral surface that faces in the upward direction. The post extends into the opening, and the base extends below the semiconductor device and the pad.

The conductive trace can include the pad, the terminal and a routing line, an electrically conductive path between the pad and the terminal can include the routing line and the pad, the terminal and the routing line can contact and overlap the adhesive.

In accordance with another aspect of the present invention, a semiconductor chip assembly includes a semiconductor device, an adhesive, a heat spreader, a substrate and a terminal. The adhesive includes an opening. The heat spreader is aluminum and includes a post and a base, wherein the post is adjacent to the base and extends above the base in an upward direction, and the base extends below the post in a downward direction opposite the upward direction and extends laterally from the post in lateral directions orthogonal to the upward and downward directions. The substrate includes a dielectric layer, and an aperture extends through the substrate. The conductive trace includes a pad and a terminal as well as a silver coating and a copper core, the silver coating is located above and overlaps the copper core and the silver coating and the copper core provide portions of the pad.

The semiconductor device is above and overlaps the post, is electrically connected to the pad and thereby electrically connected to the terminal, and is thermally connected to the post and thereby thermally connected to the base. The adhesive is mounted on and extends above the base, extends into a gap in the aperture between the post and the substrate, extends across the dielectric layer in the gap, extends laterally from the post to or beyond the terminal and is sandwiched between the post and the dielectric layer and between the base and the dielectric layer. The substrate is mounted on the adhesive and extends above the base. The copper core is coplanar with the post and the adhesive at a lateral surface that faces in the upward direction. The post extends into the opening and the aperture, and the base extends below the semiconductor device and the substrate.

The heat spreader can include a cap that is above and adjacent to and covers in the upward direction and extends laterally in the lateral directions from a top of the post. For instance, the cap can have a rectangular or square shape and the top of the post can have a circular shape. In this instance, the cap can be sized and shaped to accommodate a thermal contact surface of the semiconductor device whereas the top of the post is not sized and shaped to accommodate the thermal contact surface of the semiconductor device. The cap can also contact and cover a portion of the adhesive that is coplanar with and adjacent to the post. The cap can also be coplanar with the pad and/or the terminal above the dielectric layer. In addition, the post can thermally connect the base and the cap. The heat spreader can consist of the post and the base or the post, the base and the cap. In any case, the heat spreader provides heat dissipation and spreading from the semiconductor device to the next level assembly.

The semiconductor device can be mounted on and overlap the post but not the substrate or the conductive trace, be electrically connected to the pad using a wire bond and be thermally connected to the post using a die attach.

The semiconductor device can be a packaged or unpackaged semiconductor chip. For instance, the semiconductor device can be an LED package that includes an LED chip. Alternatively, the semiconductor device can be a semiconductor chip such as an LED chip.

The adhesive can contact the post and the dielectric layer in the gap and contact the base and the dielectric layer outside the gap. The adhesive can also cover the substrate in the downward direction, cover and surround the post in the lateral directions and cover the base outside the post in the upward direction. The adhesive can also conformally coat the sidewalls of the post and a top surface of the base outside the post. The adhesive can also fill the space between the post and the dielectric layer, fill the space between the base and the substrate and be contained in the space between the heat spreader and the substrate.

The adhesive can extend laterally from the post to or beyond the terminal. For instance, the adhesive and the terminal can extend to peripheral edges of the assembly. In this instance, the adhesive extends laterally from the post to the terminal. Alternatively, the adhesive can extend to peripheral edges of the assembly and the terminal can be spaced from the peripheral edges of the assembly. In this instance, the adhesive extends laterally from the post beyond the terminal.

The adhesive can overlap or be overlapped by the terminal. For instance, the terminal can extend above and overlap the dielectric layer and the adhesive and be coplanar with the pad. In this instance, the adhesive is overlapped by the terminal and the assembly provides horizontal signal routing between the pad and the terminal. Alternatively, the terminal can extend below and be overlapped by the dielectric layer and the adhesive and be coplanar with the base. In this instance, the adhesive overlaps the terminal and the assembly provides vertical signal routing between the pad and the terminal.

The conductive trace can consist of the silver coating and the copper core, or alternatively the silver coating, the copper core and a nickel buffer layer that contacts and is sandwiched between the silver coating and the copper core. Furthermore, the silver coating and the copper core can provide portions of the terminal and the copper core can provide the routing line.

The post can be integral with the base. For instance, the post and the base can be single-piece aluminum. The post can also extend through the aperture. The post can also be coplanar with the adhesive above the dielectric layer and coplanar with the adhesive below the dielectric layer at the base. The post can also have a cut-off conical shape in which its diameter decreases as it extends upwardly from the base to its flat top.

The base can cover the semiconductor device, the post, the adhesive and the substrate in the downward direction, support the substrate and extend to peripheral edges of the assembly.

The substrate can be spaced from the post and the base. The substrate can also be a laminated structure. The substrate can also include a single conductive layer or multiple conductive layers. For instance, the substrate can include a single conductive layer that contacts and extends above the dielectric layer. In this instance, the conductive layer includes the pad and the terminal. Thus, the substrate includes the terminal, the adhesive is overlapped by the terminal and the signal routing between the pad and the terminal occurs above but not through the dielectric layer. Alternatively, the substrate can include a first conductive layer that contacts and extends above the dielectric layer, a second conductive layer that contacts and extends below the dielectric layer, and a via that extends through the dielectric layer and electrically connects the conductive layers. In this instance, the first conductive layer includes the pad. Furthermore, (1) the first conductive layer includes the terminal and the substrate includes another via that extends through the dielectric layer and electrically connects the conductive layers, in which case the substrate includes the terminal, the adhesive is overlapped by the terminal and the signal routing between the pad and the terminal occurs through the dielectric layer but not the adhesive, or alternatively, (2) the terminal is below the adhesive and the substrate and the assembly includes another via that extends through the adhesive and electrically connects the terminal and the second conductive layer, in which case the substrate excludes the terminal, the adhesive overlaps the terminal and the signal routing between the pad and the terminal occurs through the dielectric layer and the adhesive. In any case, the substrate includes the pad and provides some or all of the signal routing between the pad and the terminal.

The pad can be an electrical contact for the semiconductor device, the terminal can be an electrical contact for the next level assembly, and the pad and the terminal can provide signal routing between the semiconductor device and the next level assembly.

The assembly can be a first-level or second-level single-chip or multi-chip device. For instance, the assembly can be a first-level package that contains a single chip or multiple chips. Alternatively, the assembly can be a second-level module that contains a single LED package or multiple LED packages, and each LED package can contain a single LED chip or multiple LED chips.

The present invention provides a method of making a semiconductor chip assembly that includes providing a post and a base, mounting an adhesive on the base including inserting the post into an opening in the adhesive, mounting a copper layer on the adhesive including aligning the post with an aperture in the copper layer, then flowing the adhesive into and upward in a gap located in the aperture between the post and the copper layer, solidifying the adhesive, then providing a conductive trace that includes a pad, a terminal, a silver coating and a copper core that is a selected portion of the copper layer, mounting a semiconductor device on the post, wherein an aluminum heat spreader includes the post and the base, electrically connecting the semiconductor device to the conductive trace and thermally connecting the semiconductor device to the heat spreader.

In accordance with an aspect of the present invention, a method of making a semiconductor chip assembly includes (1) providing a post, a base, an adhesive and a copper layer, wherein (a) the post is adjacent to the base, extends above the base in an upward direction, extends into an opening in the adhesive, is aligned with an aperture in the copper layer and is aluminum, (b) the base extends below the post in a downward direction opposite the upward direction and extends laterally from the post in lateral directions orthogonal to the upward and downward directions and is aluminum, (c) the adhesive is mounted on and extends above the base, is sandwiched between the base and the copper layer and is non-solidified, and (d) the copper layer is mounted on and extends above the adhesive, then (2) flowing the adhesive into and upward in a gap located in the aperture between the post and the copper layer, (3) solidifying the adhesive, then (4) providing a conductive trace that includes a pad and a terminal, wherein the conductive trace further includes a silver coating and a copper core, the silver coating is located above and overlaps the copper core, and the copper core is a selected portion of the copper layer that is coplanar with the post and the adhesive at a lateral surface that faces in the upward direction, (5) mounting a semiconductor device on the post, wherein an aluminum heat spreader includes the post and the base and the semiconductor device overlaps the post, (6) electrically connecting the semiconductor device to the pad, thereby electrically connecting the semiconductor device to the terminal, and (7) thermally connecting the semiconductor device to the post, thereby thermally connecting the semiconductor device to the base.

In accordance with another aspect of the present invention, a method of making a semiconductor chip assembly includes (1) providing a post and a base, wherein the post is adjacent to and integral with the base and extends above the base in an upward direction, the base extends below the post in a downward direction opposite the upward direction and extends laterally from the post in lateral directions orthogonal to the upward and downward directions and the post and the base are aluminum, (2) providing an adhesive, wherein an opening extends through the adhesive, (3) providing a copper layer, wherein an aperture extends through the copper layer, (4) mounting the adhesive on the base, including inserting the post through the opening, wherein the adhesive extends above the base and the post extends through the opening, (5) mounting the copper layer on the adhesive, including aligning the post with the aperture, wherein the copper layer extends above the adhesive and the adhesive is sandwiched between the base and the copper layer and is non-solidified, then (6) applying heat to melt the adhesive, (7) moving the base and the copper layer towards one another, thereby moving the post upward in the aperture and applying pressure to the molten adhesive between the base and the copper layer, wherein the pressure forces the molten adhesive to flow into and upward in a gap located in the aperture between the post and the copper layer, (8) applying heat to solidify the molten adhesive, thereby mechanically attaching the post and the base to the copper layer, then (9) providing a conductive trace that includes a pad and a terminal, wherein the conductive trace further includes a silver coating and a copper core, the silver coating is located above and overlaps the copper core, the copper core is a selected portion of the copper layer that is coplanar with the post and the adhesive at a lateral surface that faces in the upward direction, the silver coating and the copper core provide portions of the pad and the pad is electrically connected to the terminal, (10) mounting a semiconductor device on the post, wherein an aluminum heat spreader includes the post and the base and the semiconductor device overlaps the post, (11) electrically connecting the semiconductor device to the pad, thereby electrically connecting the semiconductor device to the terminal, and (12) thermally connecting the semiconductor device to the post, thereby thermally connecting the semiconductor device to the base.

Mounting the copper layer can include mounting the copper layer alone on the adhesive, or alternatively, attaching the copper layer to a carrier, then mounting the copper layer and the carrier on the adhesive such that the carrier overlaps the copper layer and the copper layer contacts the adhesive and is sandwiched between the adhesive and the carrier, and then, after solidifying the adhesive, removing the carrier and then providing the conductive trace.

In accordance with another aspect of the present invention, a method of making a semiconductor chip assembly includes (1) providing a post, a base, an adhesive and a substrate, wherein (a) the substrate includes a copper layer and a dielectric layer, (b) the post is adjacent to the base, extends above the base in an upward direction, extends through an opening in the adhesive, extends into an aperture in the substrate and is aluminum, (c) the base extends below the post in a downward direction opposite the upward direction, extends laterally from the post in lateral directions orthogonal to the upward and downward directions and is aluminum, (d) the adhesive is mounted on and extends above the base, is sandwiched between the base and the substrate and is non-solidified, (e) the substrate is mounted on and extends above the adhesive and the copper layer extends above the dielectric layer, and (f) a gap is located in the aperture between the post and the substrate, then (2) flowing the adhesive into and upward in the gap, (3) solidifying the adhesive, then (4) mounting a semiconductor device on the post, wherein an aluminum heat spreader includes the post and the base, the semiconductor device overlaps the post, a conductive trace includes a pad and a terminal and further includes a silver coating and a copper core, the silver coating is located above and overlaps the copper core, the copper core is a selected portion of the copper layer that is coplanar with the post and the adhesive at a lateral surface that faces in the upward direction, the silver coating and the copper core provide portions of the pad and the pad is electrically connected to the terminal, (5) electrically connecting the semiconductor device to the pad, thereby electrically connecting the semiconductor device to the terminal, and (6) thermally connecting the semiconductor device to the post, thereby thermally connecting the semiconductor device to the base.

In accordance with another aspect of the present invention, a method of making a semiconductor chip assembly includes (1) providing a post and a base, wherein the post is adjacent to and integral with the base and extends above the base in an upward direction, the base extends below the post in a downward direction opposite the upward direction and extends laterally from the post in lateral directions orthogonal to the upward and downward directions and the post and the base are aluminum, (2) providing an adhesive, wherein an opening extends through the adhesive, (3) providing a substrate that includes a copper layer and a dielectric layer, wherein an aperture extends through the substrate, (4) mounting the adhesive on the base, including inserting the post through the opening, wherein the adhesive extends above the base and the post extends through the opening, (5) mounting the substrate on the adhesive, including inserting the post into the aperture, wherein the substrate extends above the adhesive, the copper layer extends above the dielectric layer, the post extends through the opening into the aperture, the adhesive is sandwiched between the base and the substrate and is non-solidified, and a gap is located in the aperture between the post and the substrate, then (6) applying heat to melt the adhesive, (7) moving the base and the substrate towards one another, thereby moving the post upward in the aperture and applying pressure to the molten adhesive between the base and the substrate, wherein the pressure forces the molten adhesive to flow into and upward in the gap and the post and the molten adhesive extend above the dielectric layer, (8) applying heat to solidify the molten adhesive, thereby mechanically attaching the post and the base to the substrate, then (9) mounting a semiconductor device on the post, wherein an aluminum heat spreader includes the post and the base, the semiconductor device overlaps the post, a conductive trace includes a pad and a terminal and further includes a silver coating and a copper core, the silver coating is located above and overlaps the copper core, the copper core is a selected portion of the copper layer that is coplanar with the post and the adhesive at a lateral surface that faces in the upward direction, the silver coating and the copper core provide portions of the pad and the pad is electrically connected to the terminal, (10) electrically connecting the semiconductor device to the pad, thereby electrically connecting the semiconductor device to the terminal, and (11) thermally connecting the semiconductor device to the post, thereby thermally connecting the semiconductor device to the base.

Providing the post and the base can include providing an aluminum plate, forming an etch mask on the aluminum plate that selectively exposes the aluminum plate, etching the aluminum plate in a pattern defined by the etch mask, thereby forming a recess in the aluminum plate that extends into but not through the aluminum plate, and then removing the etch mask, wherein the post is an unetched portion of the aluminum plate that protrudes above the base and is laterally surrounded by the recess, and the base is an unetched portion of the aluminum plate below the post and the recess.

Providing the adhesive can include providing a prepreg with uncured epoxy, flowing the adhesive can include melting the uncured epoxy and compressing the uncured epoxy between the base and the substrate, and solidifying the adhesive can include curing the molten uncured epoxy.

Providing the pad can include removing selected portions of the copper layer after solidifying the adhesive. Providing the pad can also include removing the selected portions of the copper layer, thereby forming the copper core, and then plating the silver coating over the copper core, thereby forming the pad.

Providing the pad can also include grinding the post, the adhesive and the copper layer after solidifying the adhesive such that the post, the adhesive and the copper layer are laterally aligned with one another at a top lateral surface that faces in the upward direction, and then removing selected portions of the copper layer such that the pad includes selected portions of the copper layer. The grinding can include grinding the adhesive without grinding the post and then grinding the post, the adhesive and the copper layer. The removing can include applying a wet chemical etch to the copper layer using an etch mask that defines the pad.

Providing the terminal can include removing selected portions of the copper layer after solidifying the adhesive. Providing the terminal can also include the grinding and then removing selected portions of the copper layer using the etch mask to define the terminal such that the terminal includes selected portions of the copper layer. Providing the terminal can also include plating the silver coating over the copper core. Thus, the pad and the terminal can be formed simultaneously using the same grinding, wet chemical etch and etch mask to define the pad and the terminal and form the copper core and then silver plating over the copper core to form the silver coating for the pad and the terminal.

Providing the silver coating can include plating the silver coating on the copper core, or alternatively, plating a nickel buffer layer on the copper core and plating the silver coating on the nickel buffer layer.

Flowing the adhesive can include filling the gap with the adhesive. Flowing the adhesive can also include squeezing the adhesive through the gap, above the post and the substrate and on top surface portions of the post and the substrate adjacent to the gap.

Solidifying the adhesive can include mechanically bonding the post and the base to the substrate.

Mounting the semiconductor device can include providing a die attach between a semiconductor chip and the post, electrically connecting the semiconductor device can include providing a wire bond between the chip and the pad, and thermally connecting the semiconductor device can include providing the die attach between the chip and the post.

The adhesive can contact the post, the base and the dielectric layer, cover the substrate in the downward direction, cover and surround the post in the lateral directions and extend to peripheral edges of the assembly after the assembly is manufactured and detached from other assemblies in a batch.

The base can cover the semiconductor device, the post, the adhesive and the substrate in the downward direction, support the substrate and extend to peripheral edges of the assembly after the assembly is manufactured and detached from other assemblies in a batch.

The present invention has numerous advantages. The heat spreader can provide excellent heat spreading and heat dissipation without heat flow through the adhesive. As a result, the adhesive can be a low cost dielectric with low thermal conductivity and not prone to delamination. The heat spreader can also be aluminum, thereby reducing cost. The post and the base can be integral with one another, thereby enhancing reliability. The post can be customized for the semiconductor device, thereby enhancing the thermal connection. The adhesive can be sandwiched between the post and the substrate and between the base and the substrate, thereby providing a robust mechanical bond between the heat spreader and the substrate. The substrate can provide single-layer signal routing with simple circuitry patterns or flexible multi-layer signal routing with complex circuitry patterns. The conductive trace can provide horizontal signal routing between the pad and the terminal above the dielectric layer or vertical signal routing between the pad above the dielectric layer and the terminal below the adhesive. The base can provide mechanical support for the substrate, thereby preventing warping. The assembly can be manufactured using low temperature processes which reduces stress and improves reliability. The assembly can also be manufactured using well-controlled processes which can be easily implemented by circuit board, lead frame and tape manufacturers.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE INVENTION

Figure 1A:
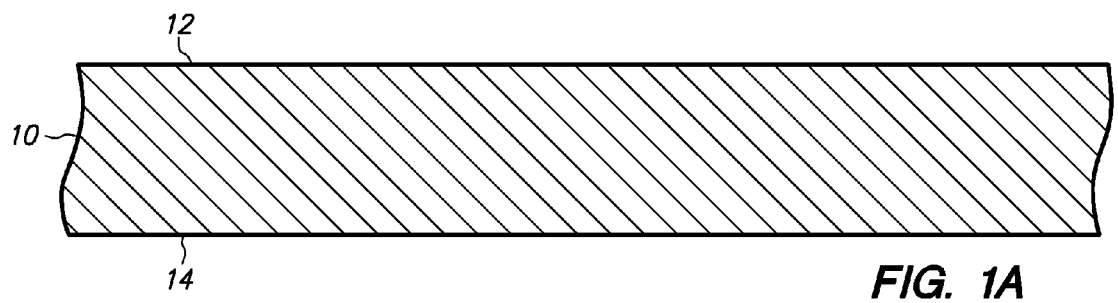
FIGS. 1A-1D are cross-sectional views showing a method of making a post and a base in accordance with an embodiment of the present invention.
Figure 1B:
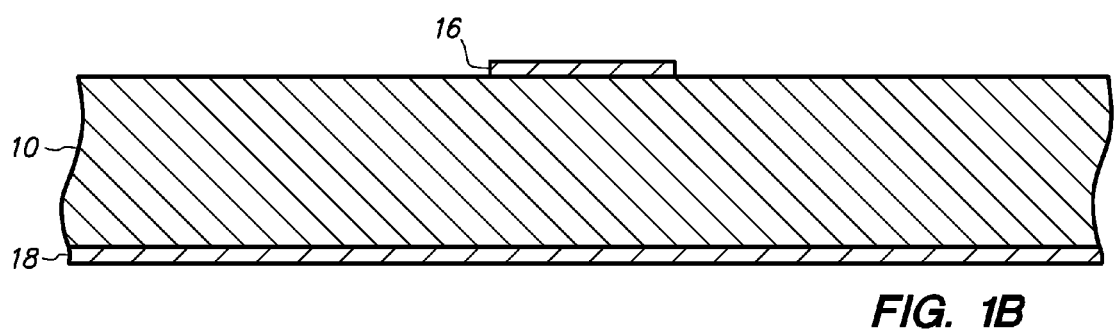
Figure 1C:
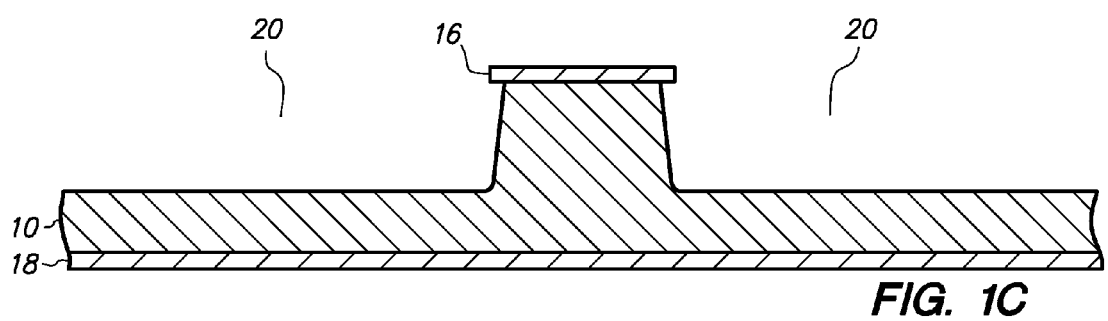
Figure 1D:
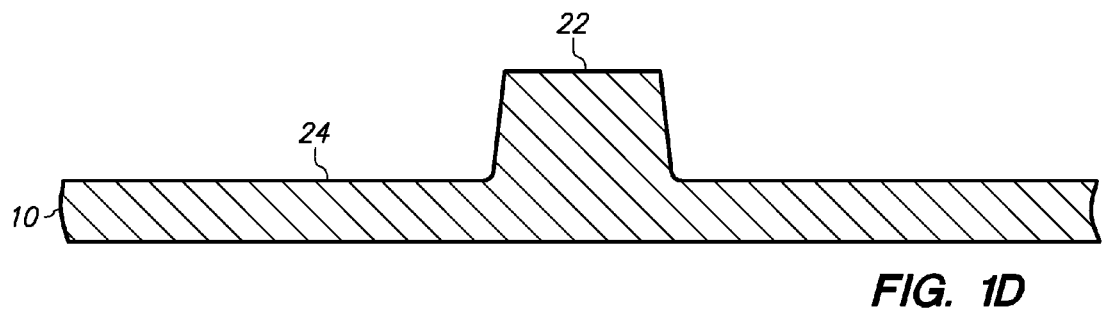
Figure 1E:
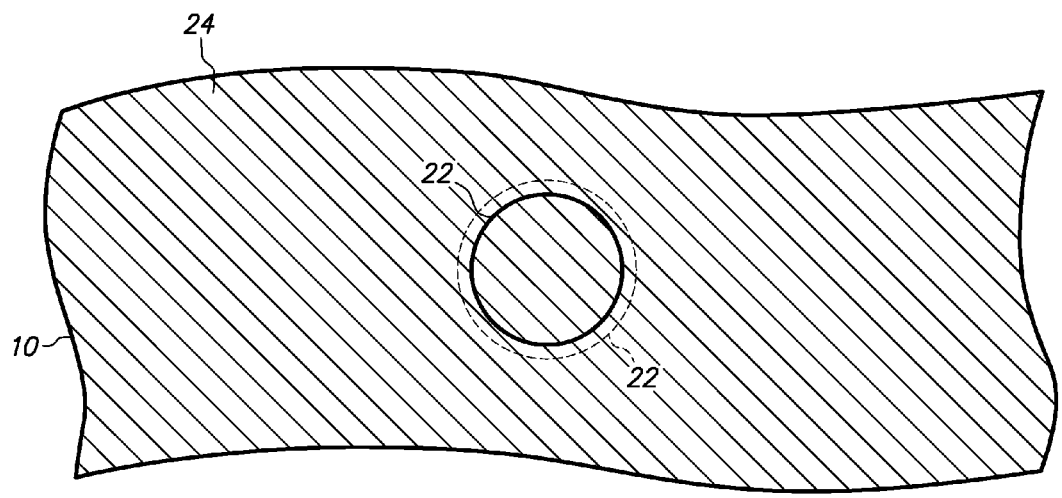
FIGS. 1E and 1F are top and bottom views, respectively, corresponding to FIG. 1D.
Figure 1F:
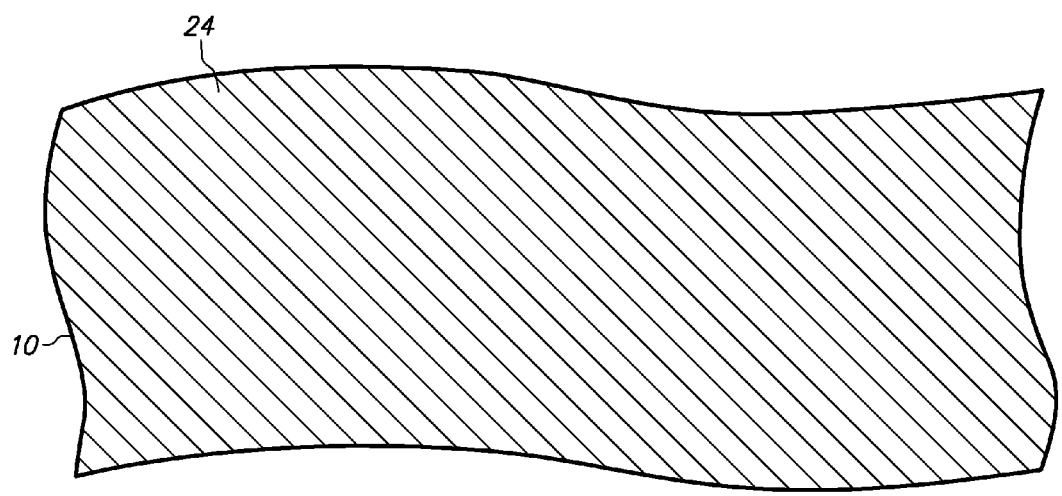

FIGS. 1A-1D are cross-sectional views showing a method of making a post and a base in accordance with an embodiment of the present invention, and FIGS. 1E and 1F are top and bottom views, respectively, corresponding to FIG. 1D.

FIG. 1A. is a cross-sectional view of aluminum plate 10 which includes opposing major surfaces 12 and 14 and has a thickness of 500 microns.

FIG. 1B is a cross-sectional view of etch mask 16 and cover mask 18 formed on aluminum plate 10. Etch mask 16 and cover mask 18 are illustrated as photoresist layers which are deposited on aluminum plate 10 using dry film lamination in which hot rolls simultaneously press photoresist layers 16 and 18 onto surfaces 12 and 14, respectively. Wet spin coating and curtain coating are also suitable deposition techniques. A reticle (not shown) is positioned proximate to photoresist layer 16. Thereafter, photoresist layer 16 is patterned by selectively applying light through the reticle so that the photoresist portions exposed to the light are rendered insoluble, applying a developer solution to remove the photoresist portions that are unexposed to the light and remain soluble and then hard baking, as is conventional. As a result, photoresist layer 16 has a pattern that selectively exposes surface 12, and photoresist layer 18 remains unpatterned and covers surface 14.

FIG. 1C is a cross-sectional view of recess 20 formed into but not through aluminum plate 10 by etching aluminum plate 10 in the pattern defined by etch mask 16. The etching is illustrated as a front-side wet chemical etch. For instance, the structure can be inverted so that etch mask 16 faces downward and cover mask 18 faces upward as a bottom spray nozzle (not shown) that faces etch mask 16 upwardly sprays the wet chemical etch on aluminum plate 10 and etch mask 16 while a top spray nozzle (not shown) that faces cover mask 18 is deactivated so that gravity assists with removing the etched byproducts. Alternatively, the structure can be dipped in the wet chemical etch since cover mask 18 provides back-side protection. The wet chemical etch is highly selective of aluminum and etches 300 microns into aluminum plate 10. As a result, recess 20 extends from surface 12 into but not through aluminum plate 10, is spaced from surface 14 by 200 microns and has a depth of 300 microns. The wet chemical etch also laterally undercuts aluminum plate 10 beneath etch mask 16. A suitable wet chemical etch can be provided by a solution containing alkaline ammonia or a dilute mixture of nitric and hydrochloric acid. Likewise, the wet chemical etch can be acidic or alkaline. The optimal etch time for forming recess 20 without excessively exposing aluminum plate 10 to the wet chemical etch can be established through trial and error.

FIGS. 1D, 1E and 1F are cross-sectional, top and bottom views, respectively, of aluminum plate 10 after etch mask 16 and cover mask 18 are removed. The photoresist layers are stripped using a solvent, such as a strong alkaline solution containing potassium hydroxide with a pH of 14, that is highly selective of photoresist with respect to aluminum.

Aluminum plate 10 as etched includes post 22 and base 24.

Post 22 is an unetched portion of aluminum plate 10 defined by etch mask 16. Post 22 is adjacent to and integral with and protrudes above base 24 and is laterally surrounded by recess 20. Post 22 has a height of 300 microns (recess 20 depth), a diameter at its top surface (circular portion of surface 12) of 1000 microns and a diameter at its bottom (circular portion adjacent to base 24) of 1100 microns. Thus, post 22 has a cut-off conical shape (resembling a frustum) with tapered sidewalls in which its diameter decreases as it extends upwardly from base 24 to its flat circular top surface. The tapered sidewalls arise from the lateral undercutting by the wet chemical etch beneath etch mask 16. The top surface is concentrically disposed within a periphery of the bottom (shown in phantom in FIG. 1E).

Base 24 is an unetched portion of aluminum plate 10 that is below post 22, extends laterally from post 22 in a lateral plane (with lateral directions such as left and right) and has a thickness of 200 microns (500-300).

Post 22 and base 24 can be treated to improve bondability to epoxy. For instance, post 22 and base 24 can be microetched to provide rougher surfaces.

Post 22 and base 24 are illustrated as a subtractively formed single-piece aluminum (copper). Post 22 and base 24 can also be a stamped single-piece aluminum formed by stamping aluminum plate 10 with a contact piece with a recess or hole that defines post 22.

Figure 2A:
FIGS. 2A and 2B are cross-sectional views showing a method of making an adhesive in accordance with an embodiment of the present invention.
Figure 2B:
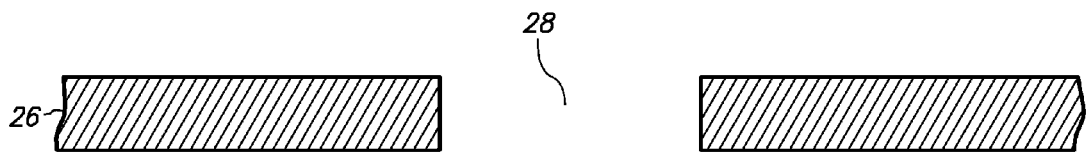
Figure 2C:
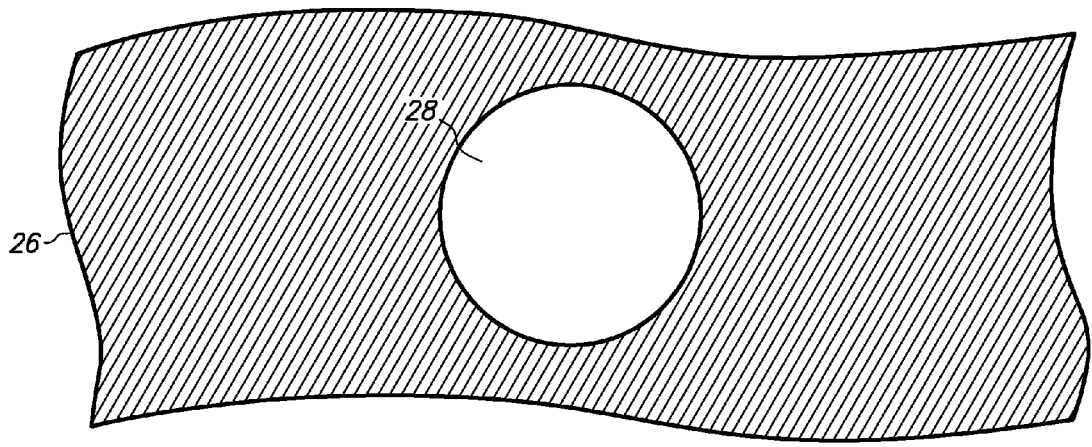
FIGS. 2C and 2D are top and bottom views, respectively, corresponding to FIG. 2B.
Figure 2D:
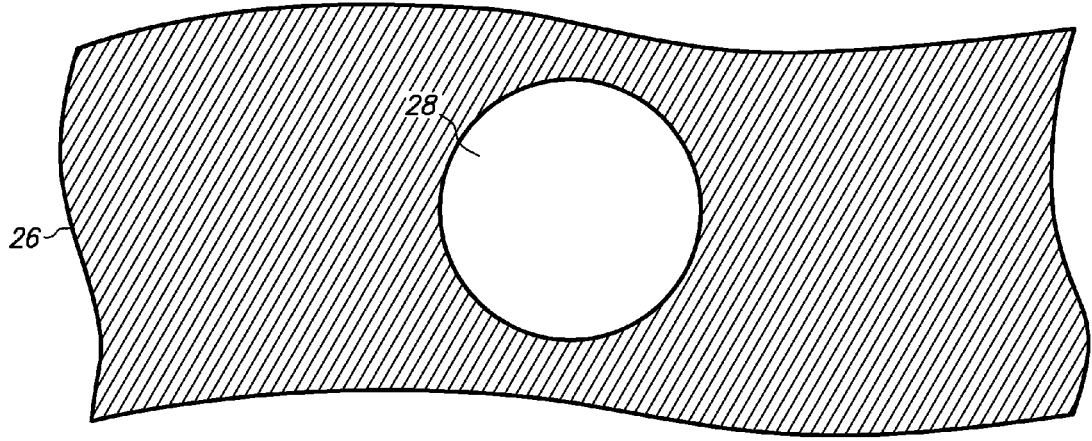

FIGS. 2A and 2B are cross-sectional views showing a method of making an adhesive in accordance with an embodiment of the present invention, and FIGS. 2C and 2D are top and bottom views, respectively, corresponding to FIG. 2B.

FIG. 2A is a cross-sectional view of adhesive 26. Adhesive 26 is illustrated as a prepreg with B-stage uncured epoxy provided as a non-solidified unpatterned sheet with a thickness of 180 microns.

Adhesive 26 can be various dielectric films or prepregs formed from numerous organic or inorganic electrical insulators. For instance, adhesive 26 can initially be a prepreg in which thermosetting epoxy in resin form impregnates a reinforcement and is partially cured to an intermediate stage. The epoxy can be FR-4 although other epoxies such as polyfunctional and bismaleimide triazine (BT) are suitable. For specific applications, cyanate esters, polyimide and PTFE are also suitable epoxies. The reinforcement can be E-glass although other reinforcements such as S-glass, D-glass, quartz, kevlar aramid and paper are suitable. The reinforcement can also be woven, non-woven or random microfiber. A filler such as silica (powdered fused quartz) can be added to the prepreg to improve thermal conductivity, thermal shock resistance and thermal expansion matching. Commercially available prepregs such as SPEEDBOARD C prepreg by W. L. Gore & Associates of Eau Claire, Wis. are suitable.

FIGS. 2B, 2C and 2D are cross-sectional, top and bottom views, respectively, of adhesive 26 with opening 28. Opening 28 is a central window that extends through adhesive 26. Opening 28 is formed by mechanical drilling through the prepreg and has a diameter of 1150 microns. Opening 28 can be formed by other techniques such as punching and stamping.

Figure 3A:
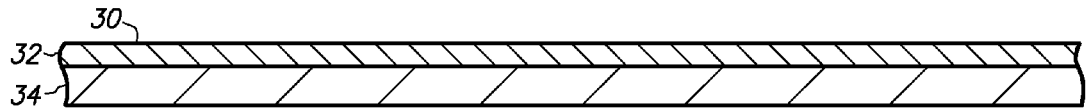
FIGS. 3A and 3B are cross-sectional views showing a method of making a substrate in accordance with an embodiment of the present invention.
Figure 3B:
Figure 3C:
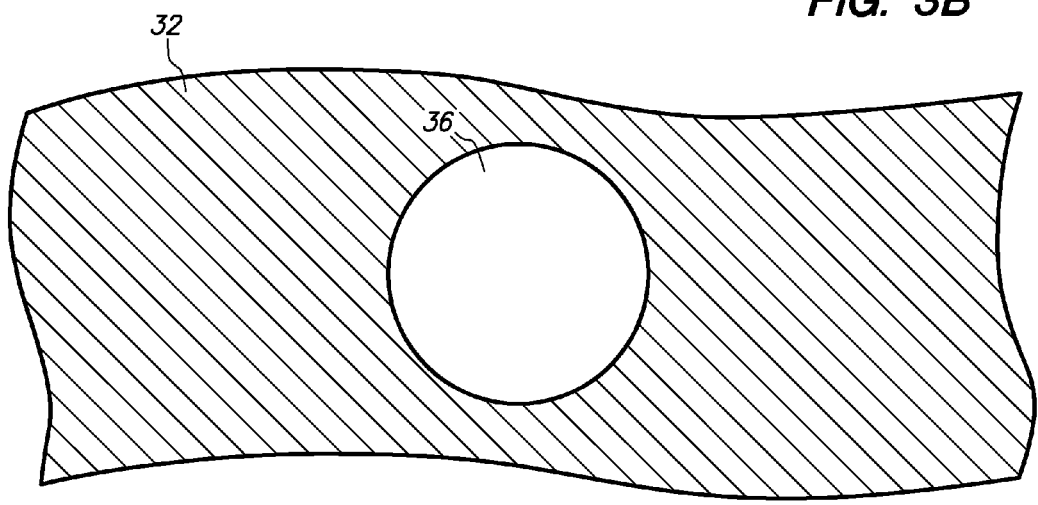
FIGS. 3C and 3D are top and bottom views, respectively, corresponding to FIG. 3B.
Figure 3D:
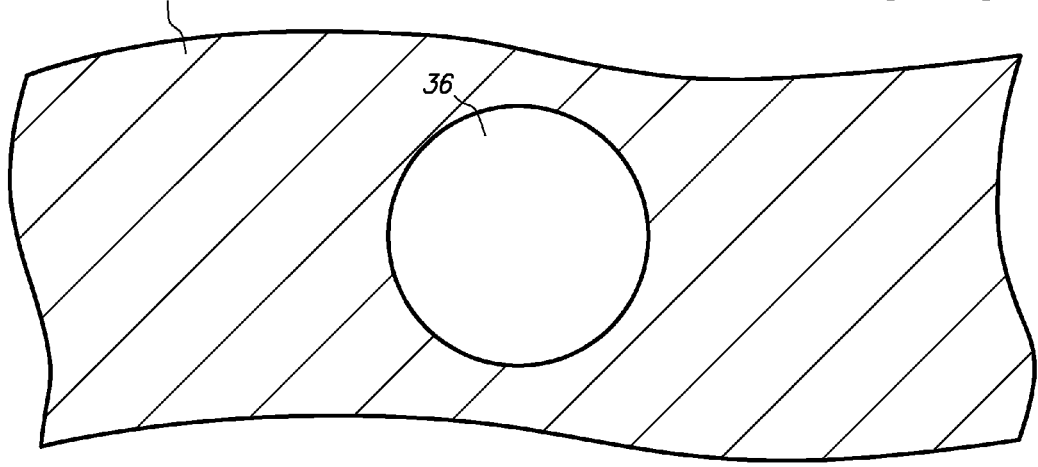

FIGS. 3A and 3B are cross-sectional views showing a method of making a substrate in accordance with an embodiment of the present invention, and FIGS. 3C and 3D are top and bottom views, respectively, corresponding to FIG. 3B.

FIG. 3A is a cross-sectional view of substrate 30 that includes copper layer 32 and dielectric layer 34. Copper layer 32 is an electrical conductor that contacts and extends above dielectric layer 34, and dielectric layer 34 is an electrical insulator. For instance, copper layer 32 is an unpatterned copper sheet with a thickness of 45 microns, and dielectric layer 34 is epoxy with a thickness of 135 microns.

FIGS. 3B, 3C and 3D are cross-sectional, top and bottom views, respectively, of substrate 30 with aperture 36. Aperture 36 is a central window that extends through substrate 30. Aperture 36 is formed by mechanical drilling through copper layer 32 and dielectric layer 34 and has a diameter of 1150 microns. Aperture 36 can be formed with other techniques such as punching and stamping. Preferably, opening 28 and aperture 36 have the same diameter and are formed in the same manner with the same drill bit at the same drilling station.

Substrate 30 is illustrated as a laminated structure. Substrate 30 can be other electrical interconnects such as a ceramic board or a printed circuit board. Likewise, substrate 30 can include additional layers of embedded circuitry.

Figure 4A:
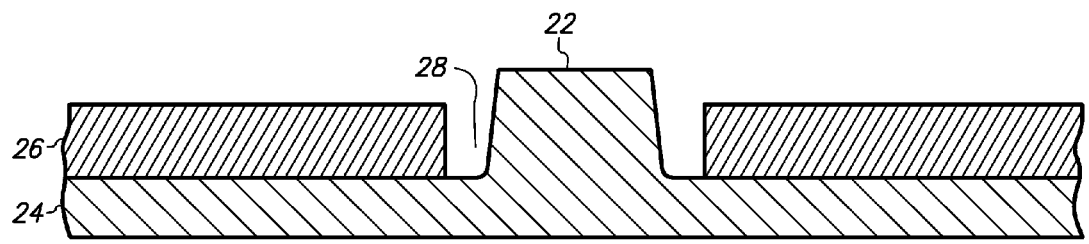
FIGS. 4A-4K are cross-sectional views showing a method of making a thermal board with horizontal signal routing in accordance with an embodiment of the present invention.
Figure 4B:
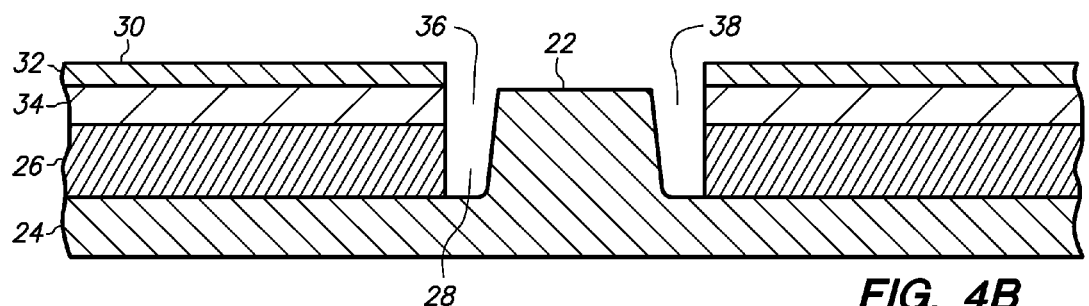
Figure 4C:
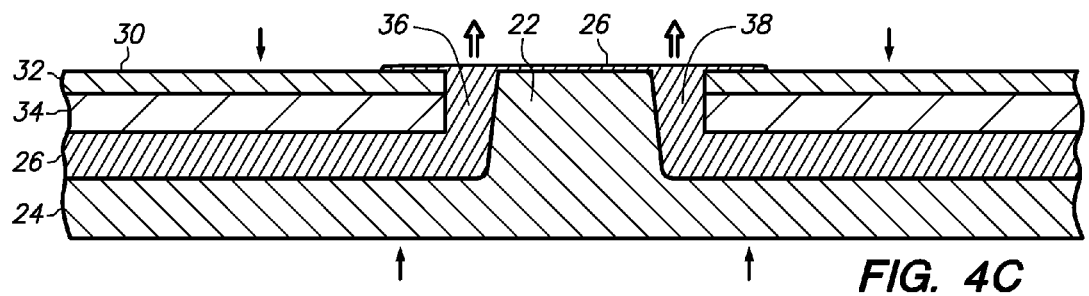
Figure 4D:
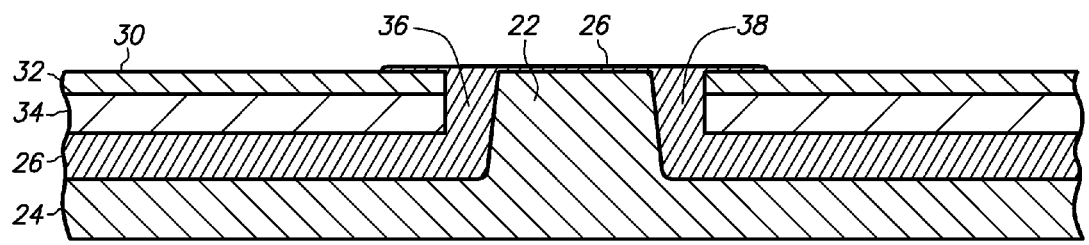
Figure 4E:
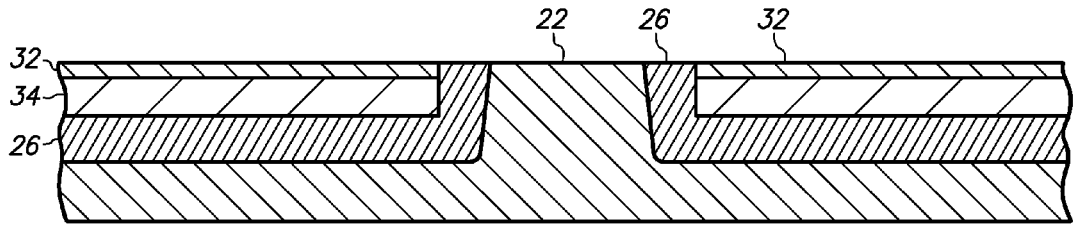
Figure 4F:
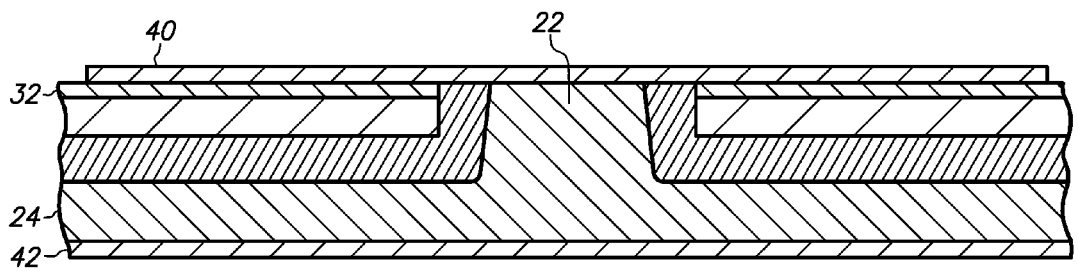
Figure 4G:
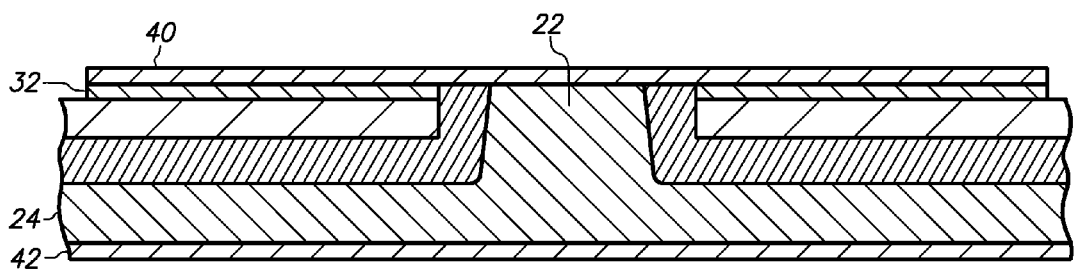
Figure 4H:
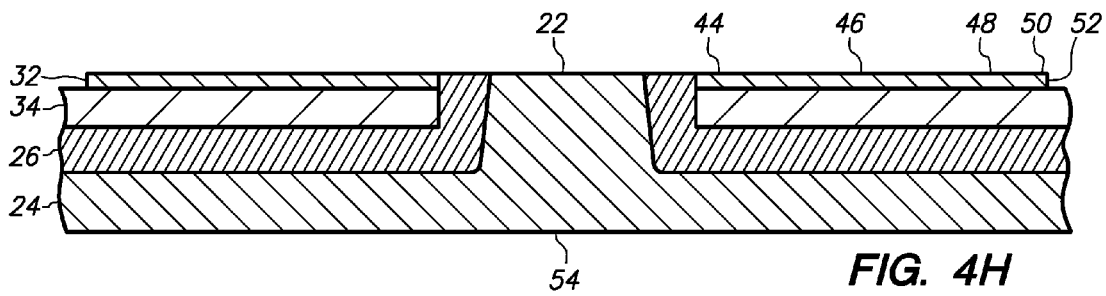
Figure 4I:
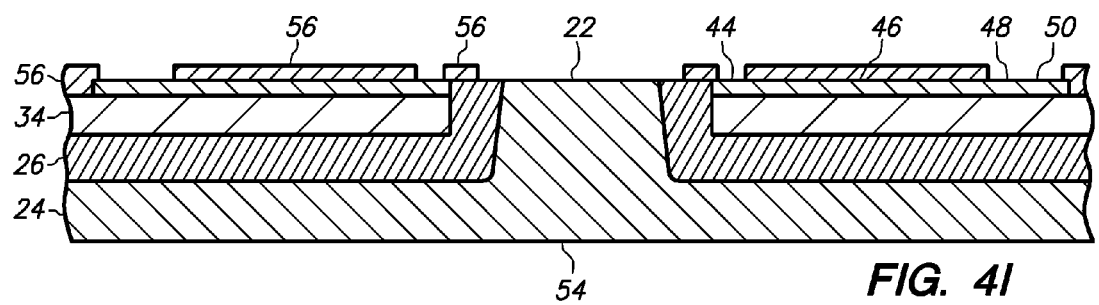
Figure 4J:
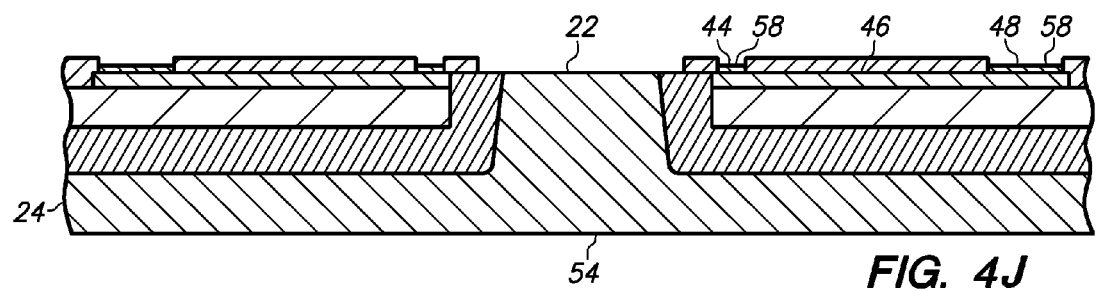
Figure 4K:
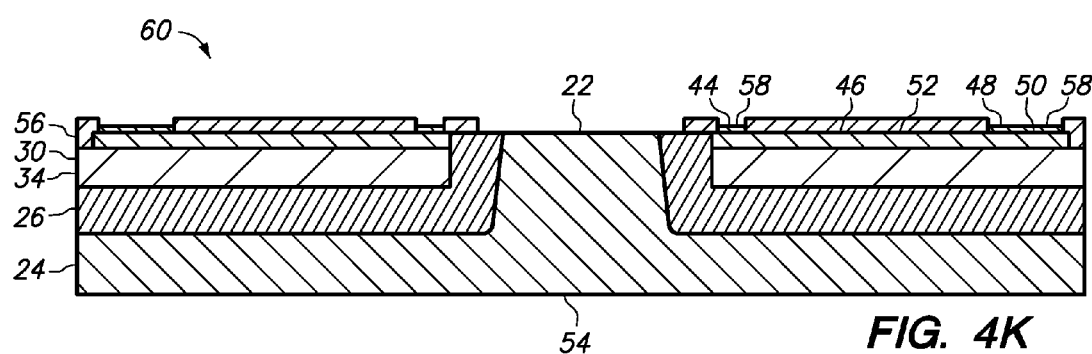
Figure 4L:
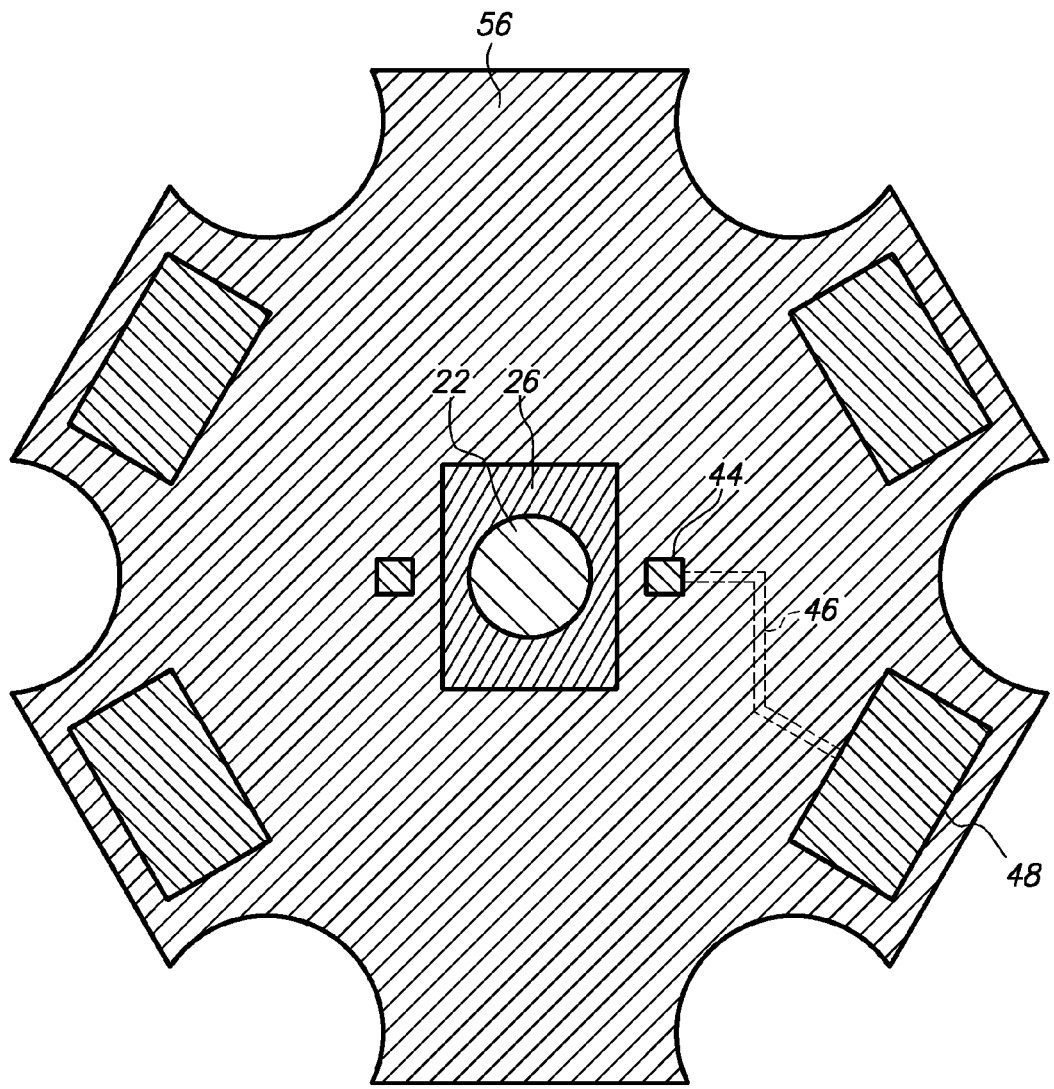
FIGS. 4L and 4M are top and bottom views, respectively, corresponding to FIG. 4K.
Figure 4M:
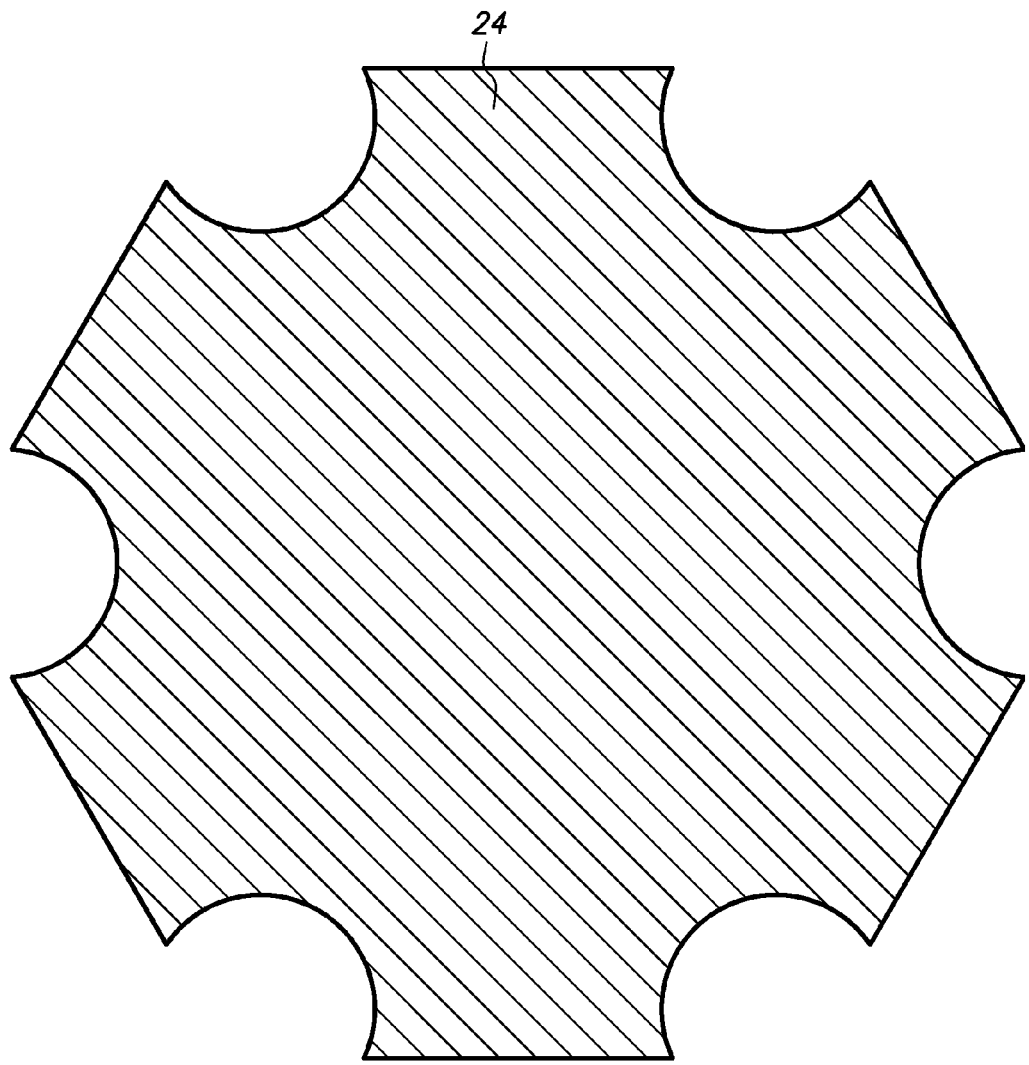

FIGS. 4A-4K are cross-sectional views showing a method of making a thermal board with horizontal signal routing that includes post 22, base 24, adhesive 26 and substrate 30 in accordance with an embodiment of the present invention, and FIGS. 4L and 4M are top and bottom views, respectively, corresponding to FIG. 4K.

FIG. 4A is a cross-sectional view of the structure with adhesive 26 mounted on base 24. Adhesive 26 is mounted by lowering it onto base 24 as post 22 is inserted into and through and upwards in opening 28. Adhesive 26 eventually contacts and rests on base 24. Preferably, post 22 is inserted into and extends through opening 28 without contacting adhesive 26 and is aligned with and centrally located within opening 28.

FIG. 4B is a cross-sectional view of the structure with substrate 30 mounted on adhesive 26. Substrate 30 is mounted by lowering it onto adhesive 26 as post 22 is inserted into and upwards in aperture 36. Substrate 30 eventually contacts and rests on adhesive 26. Preferably, post 22 is inserted into but not through aperture 36 without contacting substrate 30 and is aligned with and centrally located within aperture 36. As a result, gap 38 is located in aperture 36 between post 22 and substrate 30. Gap 38 laterally surrounds post 22 and is laterally surrounded by substrate 30. In addition, opening 28 and aperture 36 are precisely aligned with one another and have the same diameter.

At this stage, substrate 30 is mounted on and contacts and extends above adhesive 26. Post 22 extends through opening 28 into aperture 36 to dielectric layer 34, is 60 microns below the top surface of copper layer 32 and is exposed through aperture 36 in the upward direction. Adhesive 26 contacts and is sandwiched between base 24 and substrate 30, contacts dielectric layer 34 but is spaced from copper layer 32 and remains a non-solidified prepreg with B-stage uncured epoxy, and gap 38 is filled with air.

FIG. 4C is a cross-sectional view of the structure with adhesive 26 in gap 38. Adhesive 26 is flowed into gap 38 by applying heat and pressure. In this illustration, adhesive 26 is forced into gap 38 by applying downward pressure to copper layer 32 and/or upward pressure to base 24, thereby moving base 24 and substrate 30 towards one another and applying pressure to adhesive 26 while simultaneously applying heat to adhesive 26. Adhesive 26 becomes compliant enough under the heat and pressure to conform to virtually any shape. As a result, adhesive 26 sandwiched between base 24 and substrate 30 is compressed, forced out of its original shape and flows into and upward in gap 38. Base 24 and substrate 30 continue to move towards one another and adhesive 26 eventually fills gap 38. Moreover, adhesive 26 remains sandwiched between and continues to fill the reduced space between base 24 and substrate 30.

For instance, base 24 and copper layer 32 can be disposed between top and bottom platens (not shown) of a press. In addition, a top cull plate and top buffer paper (not shown) can be sandwiched between copper layer 32 and the top platen, and a bottom cull plate and bottom buffer paper (not shown) can be sandwiched between base 24 and the bottom platen. The stack includes the top platen, top cull plate, top buffer paper, substrate 30, adhesive 26, base 24, bottom buffer paper, bottom cull plate and bottom platen in descending order. Furthermore, the stack may be positioned on the bottom platen by tooling pins (not shown) that extend upward from the bottom platen through registration holes (not shown) in base 24.

The platens are heated and move towards one another, thereby applying heat and pressure to adhesive 26. The cull plates disperse the heat from the platens so that it is more uniformly applied to base 24 and substrate 30 and thus adhesive 26, and the buffer papers disperse the pressure from the platens so that it is more uniformly applied to base 24 and substrate 30 and thus adhesive 26. Initially, dielectric layer 34 contacts and presses down on adhesive 26. As the platen motion and heat continue, adhesive 26 between base 24 and substrate 30 is compressed, melted and flows into and upward in gap 38 and across dielectric layer 34 to copper layer 32. For instance, the uncured epoxy is melted by the heat and the molten uncured epoxy is squeezed by the pressure into gap 38, however the reinforcement and the filler remain between base 24 and substrate 30. Adhesive 26 elevates more rapidly than post 22 in aperture 36 and fills gap 38. Adhesive 26 also rises slightly above gap 38 and overflows onto the top surfaces of post 22 and copper layer 32 adjacent to gap 38 before the platen motion stops. This may occur due to the prepreg being slightly thicker than necessary. As a result, adhesive 26 creates a thin coating on the top surface of post 22. The platen motion is eventually blocked by post 22 and the platens become stationary but continue to apply heat to adhesive 26.

The upward flow of adhesive 26 in gap 38 is shown by the thick upward arrows, the upward motion of post 22 and base 24 relative to substrate 30 is shown by the thin upward arrows, and the downward motion of substrate 30 relative to post 22 and base 24 is shown by the thin downward arrows.

FIG. 4D is a cross-sectional view of the structure with adhesive 26 solidified.

For instance, the platens continue to clamp post 22 and base 24 and apply heat after the platen motion stops, thereby converting the B-stage molten uncured epoxy into C-stage cured or hardened epoxy. Thus, the epoxy is cured in a manner similar to conventional multi-layer lamination. After the epoxy is cured, the platens move away from one another and the structure is released from the press.

Adhesive 26 as solidified provides a secure robust mechanical bond between post 22 and substrate 30 as well as between base 24 and substrate 30. Adhesive 26 can withstand normal operating pressure without distortion or damage and is only temporarily distorted under unusually high pressure. Furthermore, adhesive 26 can absorb thermal expansion mismatch between post 22 and substrate 30 and between base 24 and substrate 30.

At this stage, post 22 and copper layer 32 are essentially coplanar with one another and adhesive 26 and copper layer 32 extend to a top surface that faces in the upward direction. For instance, adhesive 26 between base 24 and dielectric layer 34 has a thickness of 120 microns which is 60 microns less than its initial thickness of 180 microns, post 22 ascends 60 microns in aperture 36 and substrate 30 descends 60 microns relative to post 22. The 300 micron height of post 22 is essentially the same as the combined height of copper layer 32 (45 microns), dielectric layer 34 (135 microns) and the underlying adhesive 26 (120 microns). Furthermore, post 22 continues to be centrally located in opening 28 and aperture 36 and spaced from substrate 30, and adhesive 26 fills the space between base 24 and substrate 30 and fills gap 38. For instance, gap 38 (as well as adhesive 26 between post 22 and substrate 30) has a width of 75 microns ((1150−1000)/2) at the top surface of post 22. Adhesive 26 extends across dielectric layer 34 in gap 38. That is, adhesive 26 in gap 38 extends in the upward and downward directions across the thickness of dielectric layer 34 at the outer sidewall of gap 38. Adhesive 26 also includes a thin top portion above gap 38 that contacts the top surfaces of post 22 and copper layer 32 and extends above post 22 by 10 microns.

FIG. 4E is a cross-sectional view of the structure after upper portions of post 22, adhesive 26 and copper layer 32 are removed.

Post 22, adhesive 26 and copper layer 32 have their upper portions removed by grinding. For instance, a rotating diamond sand wheel and distilled water are applied to the top of the structure. Initially, the diamond sand wheel grinds only adhesive 26. As the grinding continues, adhesive 26 becomes thinner as its grinded surface migrates downwardly. Eventually the diamond sand wheel contacts post 22 and copper layer 32 (not necessarily at the same time), and as a result, begins to grind post 22 and copper layer 32 as well. As the grinding continues, post 22, adhesive 26 and copper layer 32 become thinner as their grinded surfaces migrate downwardly. The grinding continues until the desired thickness has been removed. Thereafter, the structure is rinsed in distilled water to remove contaminants.

The grinding removes a 25 micron thick upper portion of adhesive 26, a 15 micron thick upper portion of post 22 and a 15 micron thick upper portion of copper layer 32. The decreased thickness does not appreciably affect post 22 or adhesive 26. However, it substantially reduces the thickness of copper layer 32 from 45 microns to 30 microns.

At this stage, post 22, adhesive 26 and copper layer 32 are coplanar with one another at a smoothed lapped lateral top surface that is above dielectric layer 34 and faces in the upward direction.

FIG. 4F is a cross-sectional view of the structure with etch mask 40 and cover mask 42 formed on the top and bottom surfaces, respectively, of the structure. Etch mask 40 and cover mask 42 are illustrated as photoresist layers similar to photoresist layers 16 and 18, respectively. Photoresist layer 40 has a pattern that selectively exposes copper layer 32 and covers post 22, and photoresist layer 42 remains unpatterned and covers base 24.

FIG. 4G is a cross-sectional view of the structure with selected portions of copper layer 32 removed by etching copper layer 32 in the pattern defined by etch mask 40. The etching is a front-side wet chemical etch similar to the etch applied to aluminum plate 10. The wet chemical etch etches through copper layer 32 to expose adhesive 26 and dielectric layer 34 and converts copper layer 32 from an unpatterned into a patterned layer, post 22 is not affected and base 24 remains unpatterned.

FIG. 4H is a cross-sectional view of the structure after etch mask 40 and cover mask 42 are removed. Photoresist layers 40 and 42 can be stripped in the same manner as photoresist layers 16 and 18.

Copper layer 32 as etched includes pad 44, routing line 46 and terminal 48. Pad 44, routing line 46 and terminal 48 are unetched portions of copper layer 32 defined by etch mask 40. Thus, copper layer 32 is a patterned layer that includes pad 44, routing line 46 and terminal 48 and excludes post 22 and base 24. Furthermore, routing line 46 is a copper trace that contacts and extends above dielectric layer 34 and is adjacent to and electrically connects pad 44 and terminal 48.

Conductive trace 50 includes pad 44, routing line 46 and terminal 48 and at this stage is copper core 52.

Heat spreader 54 includes post 22 and base 24. Heat spreader 54 is essentially a heat slug with an inverted T-like shape that includes a pedestal (post 22) and wings (base 24 portions that extend laterally from the pedestal).

FIG. 4I is a cross-sectional view of the structure with solder mask 56 formed on dielectric layer 34 and conductive trace 50.

Solder mask 56 is an electrically insulative layer that is selectively patterned to expose post 22, pad 44 and terminal 48 and cover routing line 46 and the exposed portions of dielectric layer 34 in the upward direction. Solder mask 56 has a thickness of 25 microns above pad 44 and terminal 48 and extends 55 microns (30+25) above dielectric layer 34.

Solder mask 56 can initially be a photoimageable liquid resin that is dispensed on the structure. Thereafter, solder mask 56 is patterned by selectively applying light through a reticle (not shown) so that the solder mask portions exposed to the light are rendered insoluble, applying a developer solution to remove the solder mask portions that are unexposed to the light and remain soluble and then hard baking, as is conventional.

FIG. 4J is a cross-sectional view of the structure with silver coating 58 formed on pad 44 and terminal 48.

Silver coating 58 is a thin spot plated surface layer that contacts pad 44 and terminal 48 and covers their exposed portions in the upward direction. For instance, silver is electrolessly plated on pad 44 and terminal 48 but not post 22 or base 24 since copper is catalytic to electroless silver but aluminum is not. Silver coating 58 has a thickness of 1 micron.

Pad 44 and terminal 48 treated with silver coating 58 as a surface finish have several advantages. Silver coating 58 provides a wettable surface to facilitate solder reflow, can accommodate a solder joint or a wire bond, protects pad 44 and terminal 48 from corrosion and is highly reflective.

At this stage, the manufacture of thermal board 60 can be considered complete.

FIGS. 4K, 4L and 4M are cross-sectional, top and bottom views, respectively, of thermal board 60 after it is detached at peripheral edges along cut lines from a support frame and/or adjacent thermal boards in a batch.

Thermal board 60 includes adhesive 26, substrate 30, heat spreader 54 and solder mask 56. Substrate 30 includes dielectric layer 34 and conductive trace 50 which includes pad 44, routing line 46 and terminal 48. Heat spreader 54 includes post 22 and base 24.

Post 22 extends through opening 28 and into aperture 36, remains centrally located within opening 28 and aperture 36, is coplanar with adhesive 26 and copper core 52 above dielectric layer 34 and is coplanar with adhesive 26 below dielectric layer 34 at base 24. Post 22 retains its cut-off conical shape with tapered sidewalls in which its diameter decreases as it extends upwardly from base 24 to its flat circular top surface. Base 24 covers post 22, adhesive 26, substrate 30, conductive trace 50 and solder mask 56 in the downward direction and extends to the peripheral edges of thermal board 60.

Adhesive 26 is mounted on and extends above base 24, contacts and is sandwiched between and fills the space between post 22 and dielectric layer 34 in gap 38, contacts and is sandwiched between and fills the space between base 24 and dielectric layer 34 outside gap 38, extends laterally from post 22 beyond and is overlapped by terminal 48, covers base 24 outside the periphery of post 22 in the upward direction, covers substrate 30 in the downward direction, covers and surrounds post 22 in the lateral directions, is contained in and fills most of the space between substrate 30 and heat spreader 54 and is solidified.

Substrate 30 is mounted on and contacts adhesive 26, extends above the underlying adhesive 26 and extends above base 24, conductive trace 50 (as well as pad 44, routing line 46 and terminal 48) contacts and extends above dielectric layer 34, and dielectric layer 34 contacts and is sandwiched between adhesive 26 and conductive trace 50.

Conductive trace 50 is provided by copper core 52 and silver coating 58. In particular, pad 44 and terminal 48 are provided by copper core 52 and silver coating 58, and routing line 56 is provided by copper core 52. Thus, copper core 52 and silver coating 58 provide portions of pad 44 and terminal 48 and copper core 52 provides routing line 56. Furthermore, silver coating 58 contacts, is located above and overlaps copper core 52. Thus, copper core 52 is a buried layer (beneath solder mask 56 and silver coating 58) and silver coating 58 is an exposed surface layer. Moreover, copper core 52 is coplanar with post 22 and adhesive 26 at a lateral surface that faces in the upward direction and silver coating 58 is located above and adjacent to the lateral surface.

Conductive trace 50 provides horizontal (lateral) fan-out routing from pad 44 to terminal 48. Similarly, an electrically conductive path between pad 44 and terminal 48 is routing line 46. Conductive trace 50 is not be limited to this configuration. For instance, the electrically conductive path can include vias that extend through dielectric layer 34 and additional routing lines (above and/or below dielectric layer 34) as well as passive components such as resistors and capacitors mounted on additional pads.

Post 22 and base 24 remain spaced from substrate 30. As a result, substrate 30 and heat spreader 54 are mechanically attached and electrically isolated from one another.

Base 24, adhesive 26, dielectric layer 34 and solder mask 56 extend to straight vertical peripheral edges of thermal board 60 after it is detached or singulated from a batch of identical simultaneously manufactured thermal boards.

Pad 44 is customized as an electrical interface for a semiconductor device such as an LED package or a semiconductor chip that is subsequently mounted on post 22, terminal 48 is customized as an electrical interface for the next level assembly such as a solderable wire from a printed circuit board, and base 24 is customized as a thermal interface for the next level assembly such as a heat sink for an electronic device. Furthermore, post 22 is thermally connected to base 24.

Pad 44 and terminal 48 are laterally offset from one another and exposed at the top surface of thermal board 60, thereby providing horizontal fan-out routing between the semiconductor device and the next level assembly. Pad 44 and terminal 48 are also coplanar with one another at their top surfaces above dielectric layer 34.

Conductive trace 50 is shown in cross-section as a continuous circuit trace for convenience of illustration. However, conductive trace 50 typically provides horizontal signal routing in both the X and Y directions. That is, pad 44 and terminal 48 are laterally offset from one another in the X and Y directions, and routing line 46 routes in the X and Y directions.

Heat spreader 54 provides heat spreading and heat dissipation from a semiconductor device that is subsequently mounted on post 22 to the next level assembly that thermal board 60 is subsequently mounted on. The semiconductor device generates heat that flows into post 22 and through post 22 into base 24 where it is spread out and dissipated in the downward direction, for instance to an underlying heat sink.

Thermal board 60 does not expose routing line 46. Routing line 46 is covered by solder mask 56 and is shown in phantom in FIG. 4M for convenience of illustration.

Thermal board 60 includes other conductive traces 50 that typically include pad 44, routing line 46 and terminal 48. A single conductive trace 50 is described and labeled for convenience of illustration. In conductive traces 50, pads 44 and terminals 48 generally have identical shapes and sizes whereas routing lines 46 may (but need not) have different routing configurations. For instance, some conductive traces 50 may be spaced and separated and electrically isolated from one another whereas other conductive traces 50 can intersect or route to the same pad 44, routing line 46 or terminal 48 and be electrically connected to one another. Likewise, some pads 44 may receive independent signals whereas other pads 44 share a common signal, power or ground.

Thermal board 60 can be adapted for an LED package with blue, green and red LED chips, with each LED chip including an anode and a cathode and each LED package including a corresponding anode terminal and cathode terminal. In this instance, thermal board 60 can include six pads 44 and four terminals 48 so that each anode is routed from a separate pad 44 to a separate terminal 48 whereas each cathode is routed from a separate pad 44 to a common ground terminal 48.

A brief cleaning step can be applied to the structure at various manufacturing stages to remove oxides and debris that may be present on the exposed metal. For instance, a brief oxygen plasma cleaning step can be applied to the structure. Alternatively, a brief wet chemical cleaning step using a solution containing potassium permanganate can be applied to the structure. Likewise, the structure can be rinsed in distilled water to remove contaminants. The cleaning step cleans the desired surfaces without appreciably affecting or damaging the structure.

Advantageously, there is no plating bus or related circuitry that need be disconnected or severed from conductive traces 50 after they are formed. A plating bus can be disconnected during the wet chemical etch that forms pad 44, routing line 46 and terminal 48.

Thermal board 60 can include registration holes (not shown) that are drilled or sliced through base 24, adhesive 26, substrate 30 and solder mask 56 so that thermal board 60 can be positioned by inserting tooling pins through the registration holes when it is subsequently mounted on an underlying carrier.

Thermal board 60 can accommodate multiple semiconductor devices rather than one. This can be accomplished by adjusting etch mask 16 to define additional posts 22, adjusting adhesive 26 to include additional openings 28, adjusting substrate 30 to include additional apertures 36, adjusting etch mask 40 to define additional pads 44, routing lines 46 and terminals 48 and adjusting solder mask 56 to contain additional openings. The elements except for terminals 48 can be laterally repositioned to provide a 2×2 array for four semiconductor devices. In addition, the topography (lateral shape) can be adjusted for some but not all of the elements. For instance, pads 44 and terminals 48 can retain the same topography whereas routing lines 46 have different routing configurations.

Figure 5A:
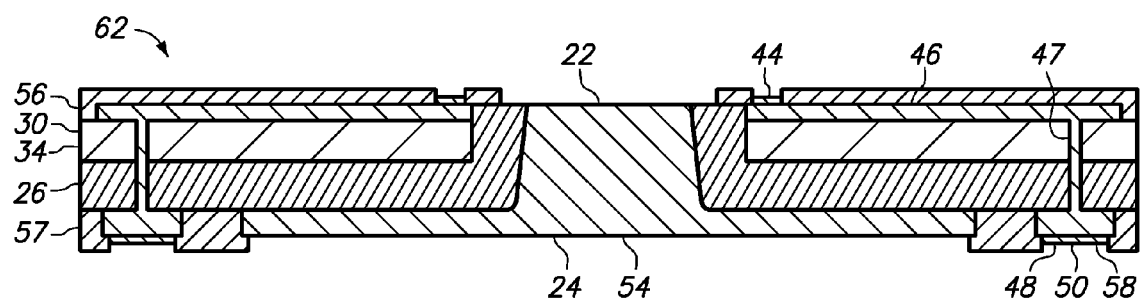
FIGS. 5A, 5B and 5C are cross-sectional, top and bottom views, respectively, of a thermal board with vertical signal routing in accordance with an embodiment of the present invention.
Figure 5B:
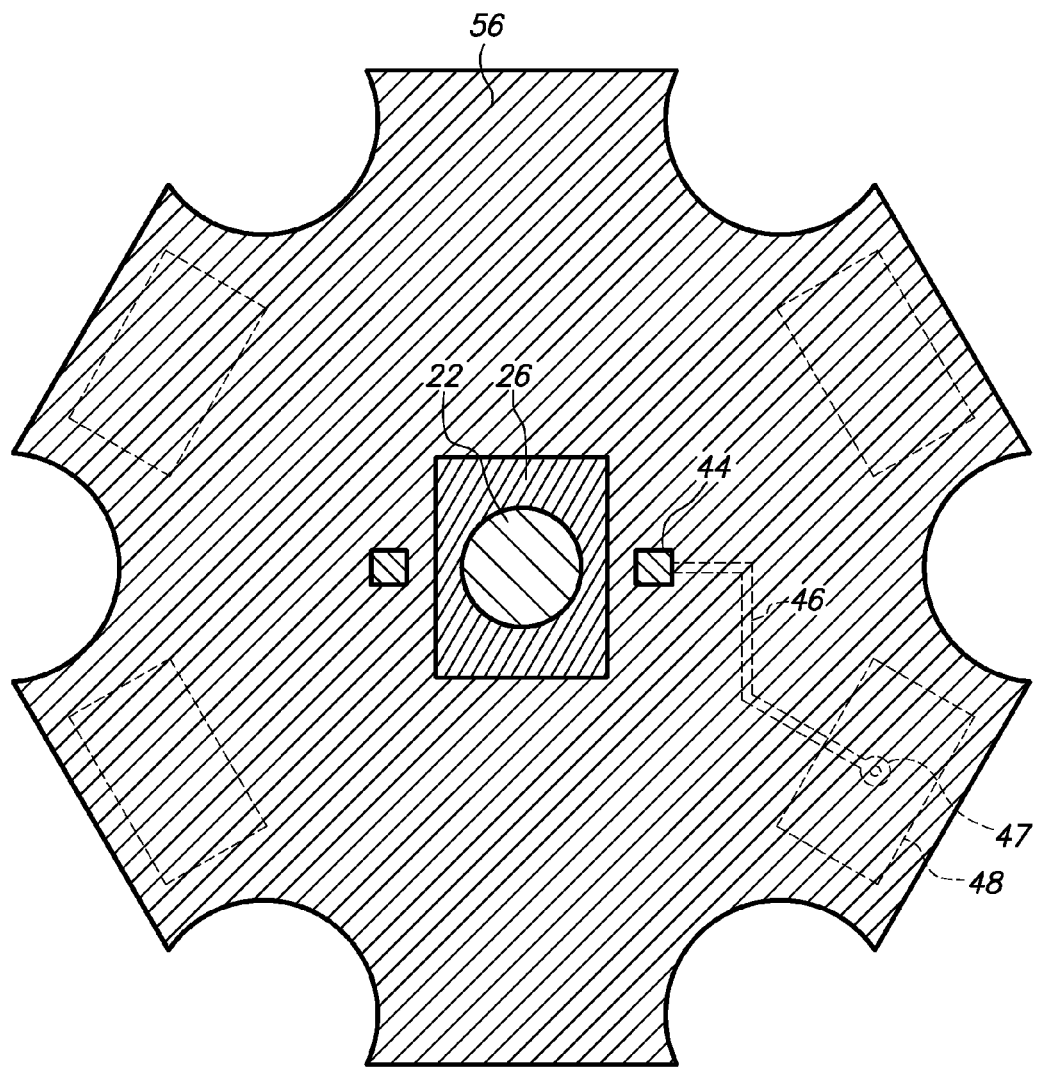
Figure 5C:
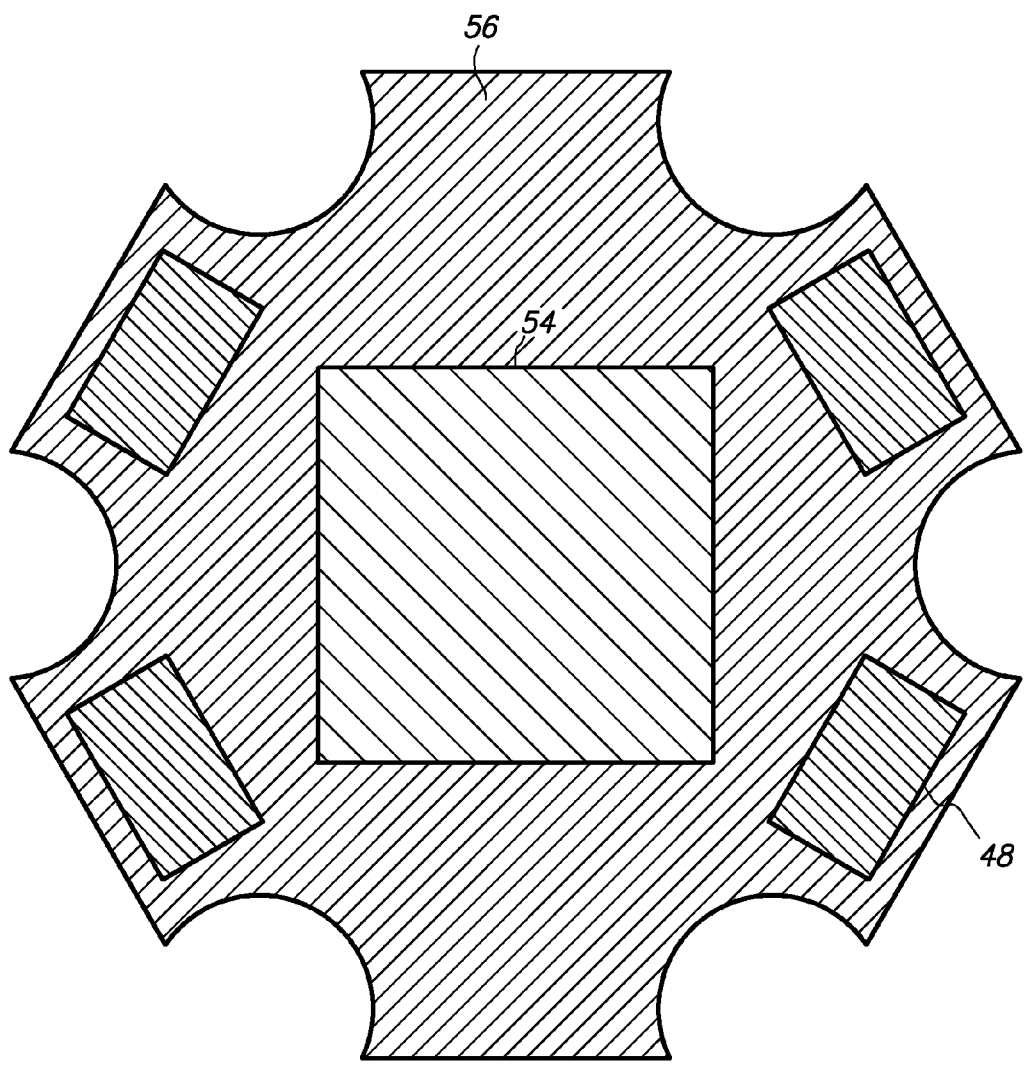

FIGS. 5A, 5B and 5C are cross-sectional, top and bottom views, respectively, of a thermal board with vertical signal routing in accordance with an embodiment of the present invention.

In this embodiment, the terminal is located at the bottom of the thermal board. For purposes of brevity, any description of thermal board 60 is incorporated herein insofar as the same is applicable, and the same description need not be repeated. Likewise, elements of the thermal board similar to those in thermal board 60 have corresponding reference numerals.

Thermal board 62 includes adhesive 26, substrate 30, conductive trace 50, heat spreader 54 and solder masks 56 and 57. Substrate 30 includes dielectric layer 34. Conductive trace 50 includes pad 44, routing line 46, via 47 and terminal 48. Heat spreader 54 includes post 22 and base 24.

Base 24 is thinner in this embodiment than the previous embodiment and is spaced from the peripheral edges of thermal board 62. Base 24 covers post 22 but not adhesive 26, substrate 30, conductive trace 50 or solder masks 56 and 57 in the downward direction. Base 24 also supports substrate 30 and is coplanar with terminal 48 below adhesive 26.

Via 47 is an electrical conductor that extends vertically from routing line 46 through dielectric layer 34 and adhesive 26 to terminal 48. Furthermore, terminal 48 contacts and extends below adhesive 26, is spaced from and extends below substrate 30 and is spaced from and located between base 24 and the peripheral edges of thermal board 62. Thus, adhesive 26 extends laterally from post 22 beyond and overlaps terminal 48, via 47 is adjacent to and electrically connects routing line 46 and terminal 48, and conductive trace 50 provides vertical (top to bottom) signal routing from pad 44 to terminal 48.

Solder mask 57 is an electrically insulative layer similar to solder mask 56 that exposes base 24 and terminal 48 and covers the exposed portions of adhesive 26 in the downward direction.

Thermal board 62 can be manufactured in a manner similar to thermal board 60 with suitable adjustments for base 24, conductive trace 50 and solder masks 56 and 57. For instance, aluminum plate 10 has a thickness of 330 microns (rather than 500 microns) so that base 24 has a thickness of 30 microns (rather than 200 microns). Thereafter, adhesive 26 is mounted on base 24, substrate 30 is mounted on adhesive 26, heat and pressure are applied to flow and solidify adhesive 26 and then grinding is applied to planarize the top surface as previously described. Next, a hole is drilled downward through copper layer 32, dielectric layer 34 and adhesive 26 into but not through base 24 and then via 47 is deposited into the hole by electroplating, screen printing or dispensing by an injection nozzle in step-and-repeat fashion. Thereafter, copper layer 32 is etched to form pad 44 and routing line 46 and base 24 is etched to form terminal 48. Base 24 as etched is reduced to its central portion and terminal 48 is an unetched portion of base 24 that contacts and extends below adhesive 26, is spaced and separated from and no longer a part of base 24 and is adjacent to via 47. Thereafter, solder mask 56 is formed on the top surface to selectively expose post 22 and pad 44, solder mask 57 is formed on the bottom surface to selectively expose base 24 and terminal 48 and then silver coating 58 provides a surface finish for pad 44 but not terminal 48 since its aluminum.

Figure 6A:
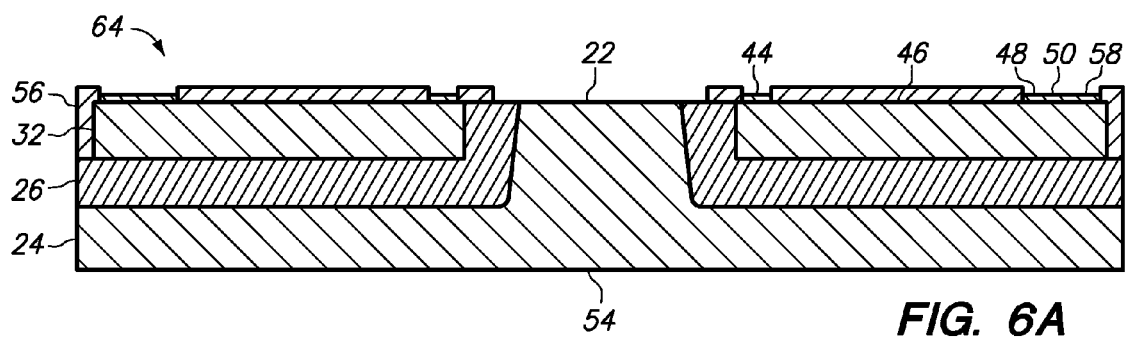
FIGS. 6A, 6B and 6C are cross-sectional, top and bottom views, respectively, of a thermal board with a conductive trace on an adhesive in accordance with an embodiment of the present invention.
Figure 6B:
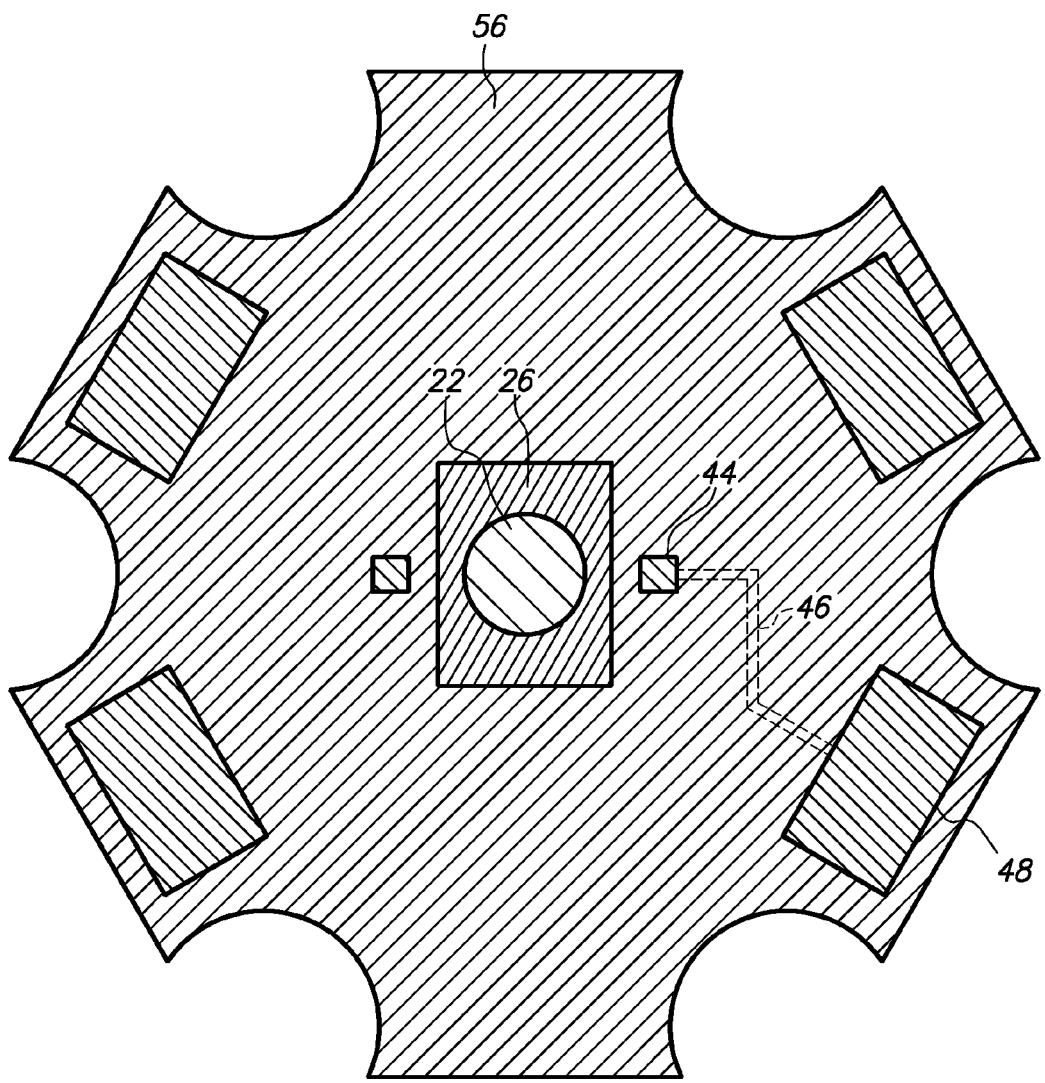
Figure 6C:
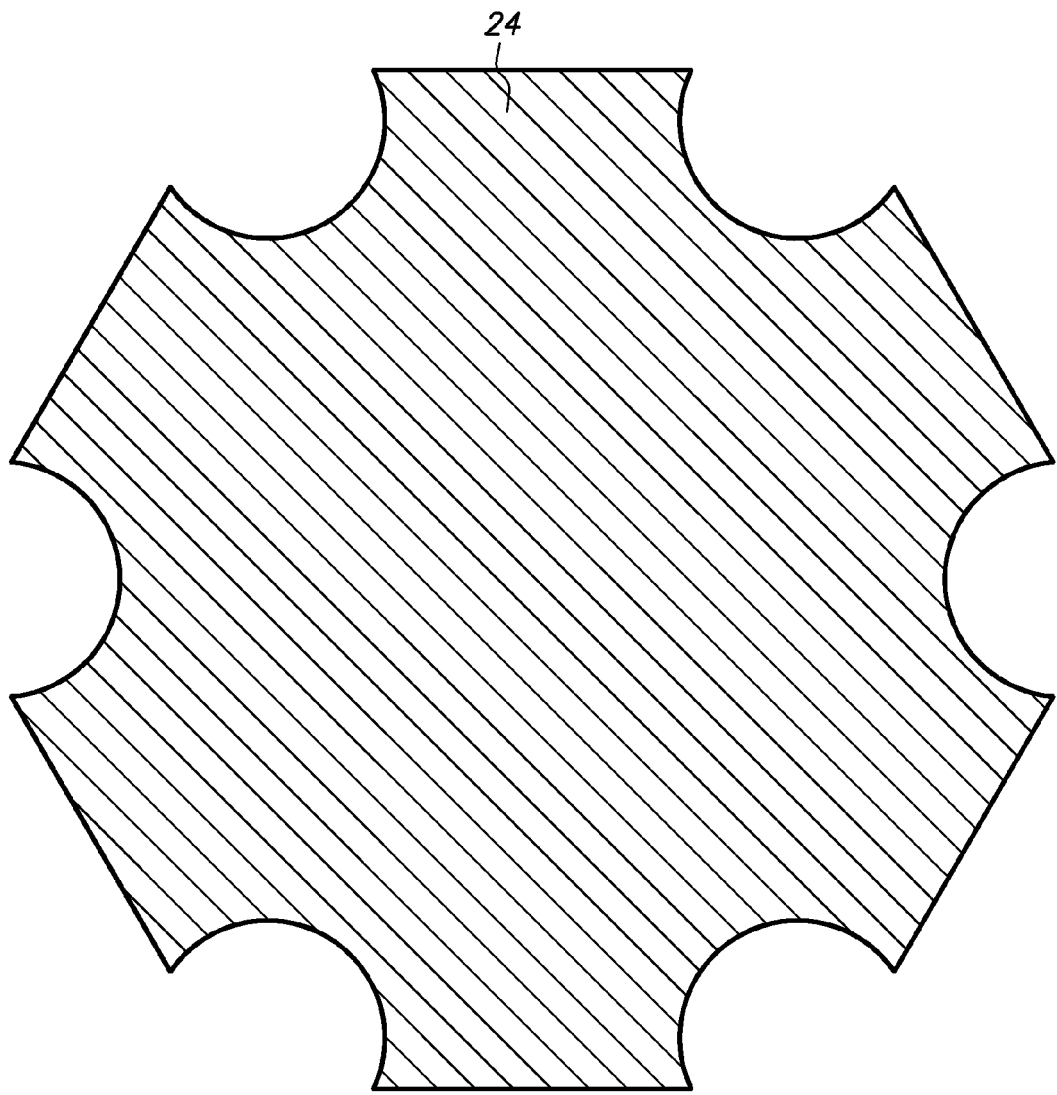

FIGS. 6A, 6B and 6C are cross-sectional, top and bottom views, respectively, of a thermal board with a conductive trace on an adhesive in accordance with an embodiment of the present invention.

In this embodiment, the conductive trace contacts the adhesive and the dielectric layer is omitted. For purposes of brevity, any description of thermal board 60 is incorporated herein insofar as the same is applicable, and the same description need not be repeated. Likewise, elements of the thermal board similar to those in thermal board 60 have corresponding reference numerals.

Thermal board 64 includes adhesive 26, conductive trace 50, heat spreader 54 and solder mask 56. Conductive trace 50 includes pad 44, routing line 46 and terminal 48. Heat spreader 54 includes post 22 and base 24.

Copper layer 32 is thicker in this embodiment than the previous embodiment. For instance, copper layer 32 has a thickness of 125 microns (rather than 45 microns) so that it can be handled without warping or wobbling. Pad 44, routing line 46 and terminal 48 are therefore thicker and contact and overlap adhesive 26, and thermal board 64 is devoid of a dielectric layer corresponding to dielectric layer 34.

Thermal board 64 can be manufactured in a manner similar to thermal board 60 with suitable adjustments for post 22 and copper layer 32. For instance, post 22 has a height of 200 microns (rather than 300 microns) so that base 24 has a thickness of 300 microns (rather than 200 microns). This can be accomplished by reducing the etch time. Thereafter, adhesive 26 is mounted on base 24, copper layer 32 alone is mounted on adhesive 26, heat and pressure are applied to flow and solidify adhesive 26 and then grinding is applied to planarize the top surface as previously described. Thereafter, copper layer 32 is etched to form pad 44, routing line 46 and terminal 48, then solder mask 56 is formed on the top surface to selectively expose post 22, pad 44 and terminal 48 and then silver coating 58 provides a surface finish for pad 44 and terminal 48.

Figure 7A:
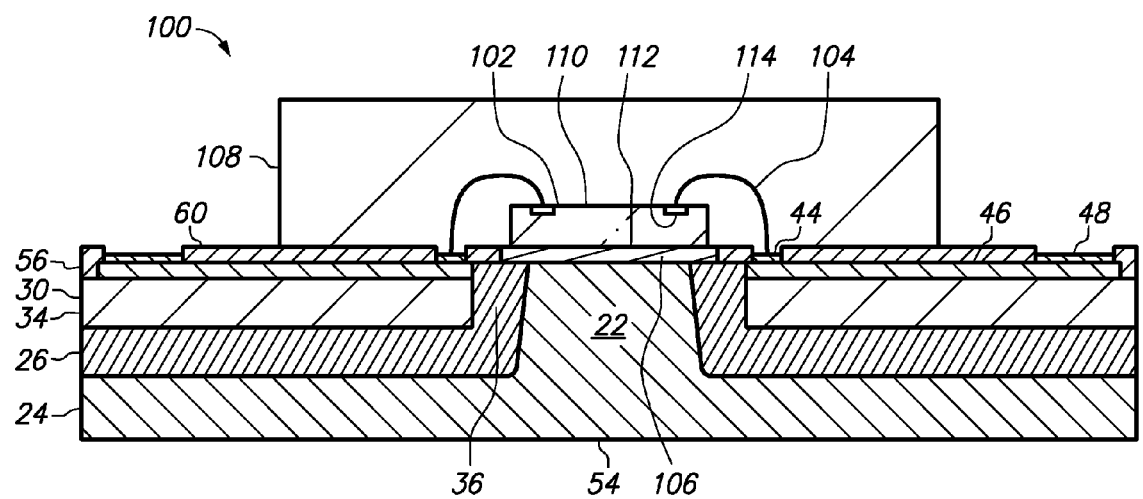
FIGS. 7A, 7B and 7C are cross-sectional, top and bottom views, respectively, of a semiconductor chip assembly that includes a thermal board and a semiconductor chip in accordance with an embodiment of the present invention.
Figure 7B:
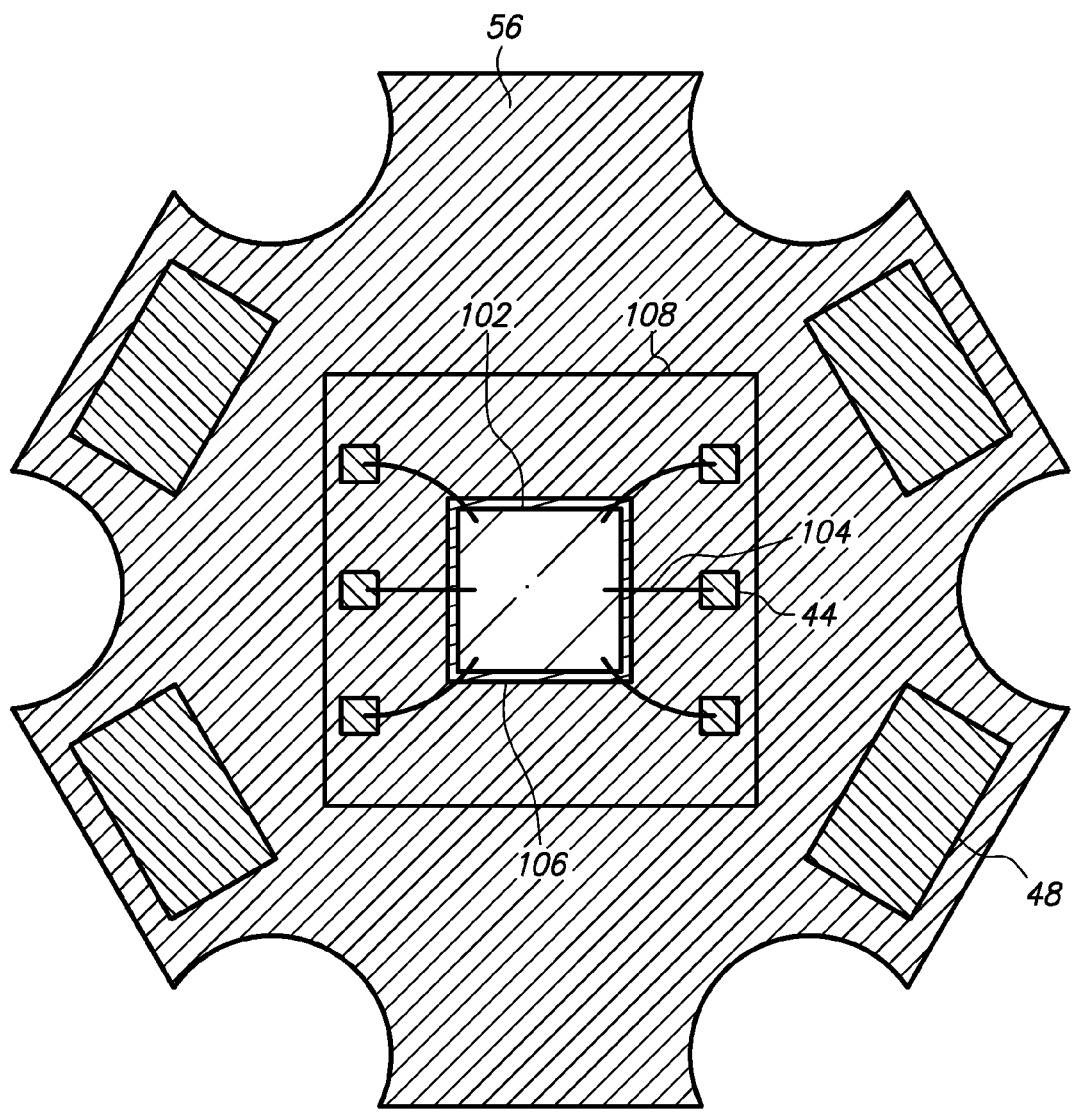
Figure 7C:
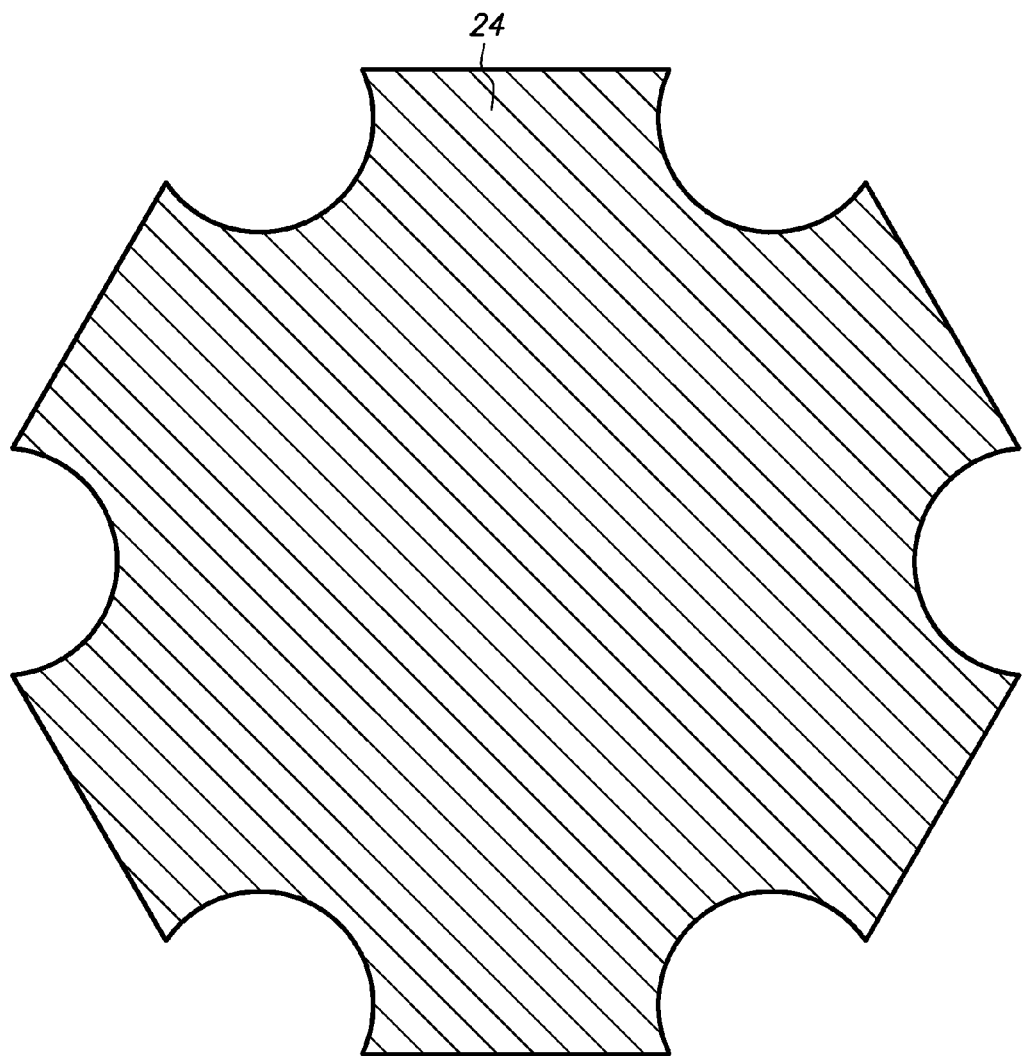

FIGS. 7A, 7B and 7C are cross-sectional, top and bottom views, respectively, of a semiconductor chip assembly that includes a thermal board and a semiconductor chip in accordance with an embodiment of the present invention.

In this embodiment, the semiconductor device is a chip that is mounted on the post, is electrically connected to the pad using a wire bond and is thermally connected to the post using a die attach.

Semiconductor chip assembly 100 includes thermal board 60, chip 102, wire bond 104, die attach 106 and encapsulant 108. Chip 102 includes top surface 110, bottom surface 112 and bond pad 114. Top surface 110 is the active surface and includes bond pad 114 and bottom surface 112 is the thermal contact surface.

Chip 102 is mounted on heat spreader 54, electrically connected to substrate 30 and thermally connected to heat spreader 54. In particular, chip 102 is mounted on post 22, is above and overlaps post 22 but does not overlap adhesive 26 or substrate 30, is electrically connected to substrate 30 by wire bond 104 and is thermally connected to and mechanically attached to heat spreader 54 by die attach 106. For instance, wire bond 104 is bonded to and electrically connects pads 44 and 114, thereby electrically connecting chip 102 to terminal 48. Likewise, die attach 106 contacts and is sandwiched between and thermally connects and mechanically attaches post 22 and thermal contact surface 112, thereby thermally connecting chip 102 to base 24. Pad 44 is spot plated with silver coating 58 to bond well with wire bond 104, thereby improving signal transfer from substrate 30 to chip 102, and post 22 is shaped and sized to accommodate thermal contact surface 112, thereby improving heat transfer from chip 102 to heat spreader 54. Encapsulant 108 is a solid adherent electrically insulative protective plastic enclosure that provides environmental protection such as moisture resistance and particle protection for chip 102 and wire bond 104. Chip 102 and wire bond 104 are embedded in encapsulant 108. Furthermore, encapsulant 108 can be transparent if chip 102 is an optical chip such as an LED. Encapsulant 108 is transparent in FIG. 7B for convenience of illustration.

Semiconductor chip assembly 100 can be manufactured by mounting chip 102 on post 22 using die attach 106, then wire bonding pads 44 and 114 and then forming encapsulant 108.

For instance, die attach 106 is initially a silver-filled epoxy paste with high thermal conductivity that is selectively screen printed on post 22 and then chip 102 placed on the epoxy paste using a pick-up head and an automated pattern recognition system in step-and-repeat fashion. Thereafter, the epoxy paste is heated and hardened at a relatively low temperature such as 190° C. to form die attach 106. Next, wire bond 104 is a gold wire that is thermosonically ball bonded to pads 44 and 114 and then encapsulant 108 is transfer molded on the structure.

Chip 102 can be electrically connected to pad 44 by a wide variety of connection media, thermally connected to and mechanically attached to heat spreader 54 by a wide variety of thermal adhesives and encapsulated by a wide variety of encapsulants.

Semiconductor chip assembly 100 is a first-level single-chip package.

Figure 8A:
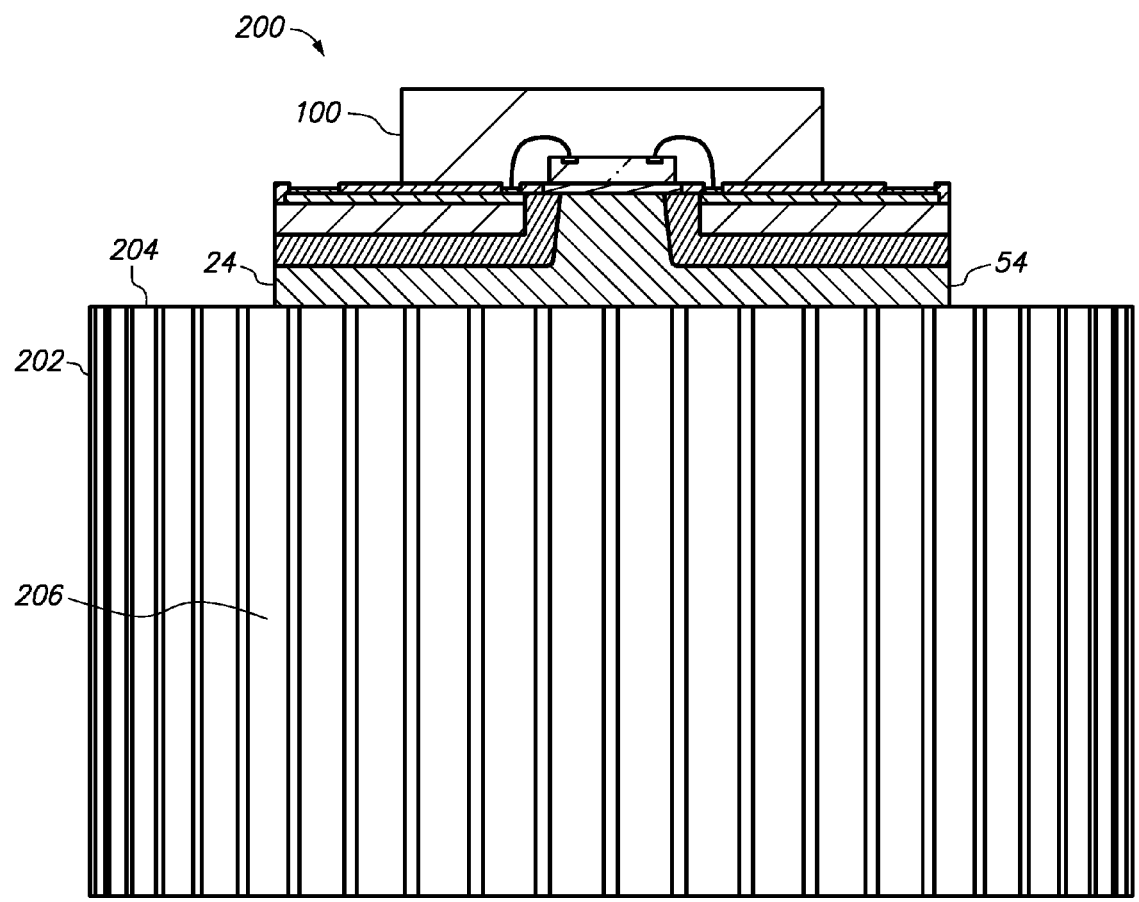
FIGS. 8A, 8B and 8C are cross-sectional, top and bottom views, respectively, of a light source subassembly that includes a semiconductor chip assembly and a heat sink in accordance with an embodiment of the present invention.
Figure 8B:
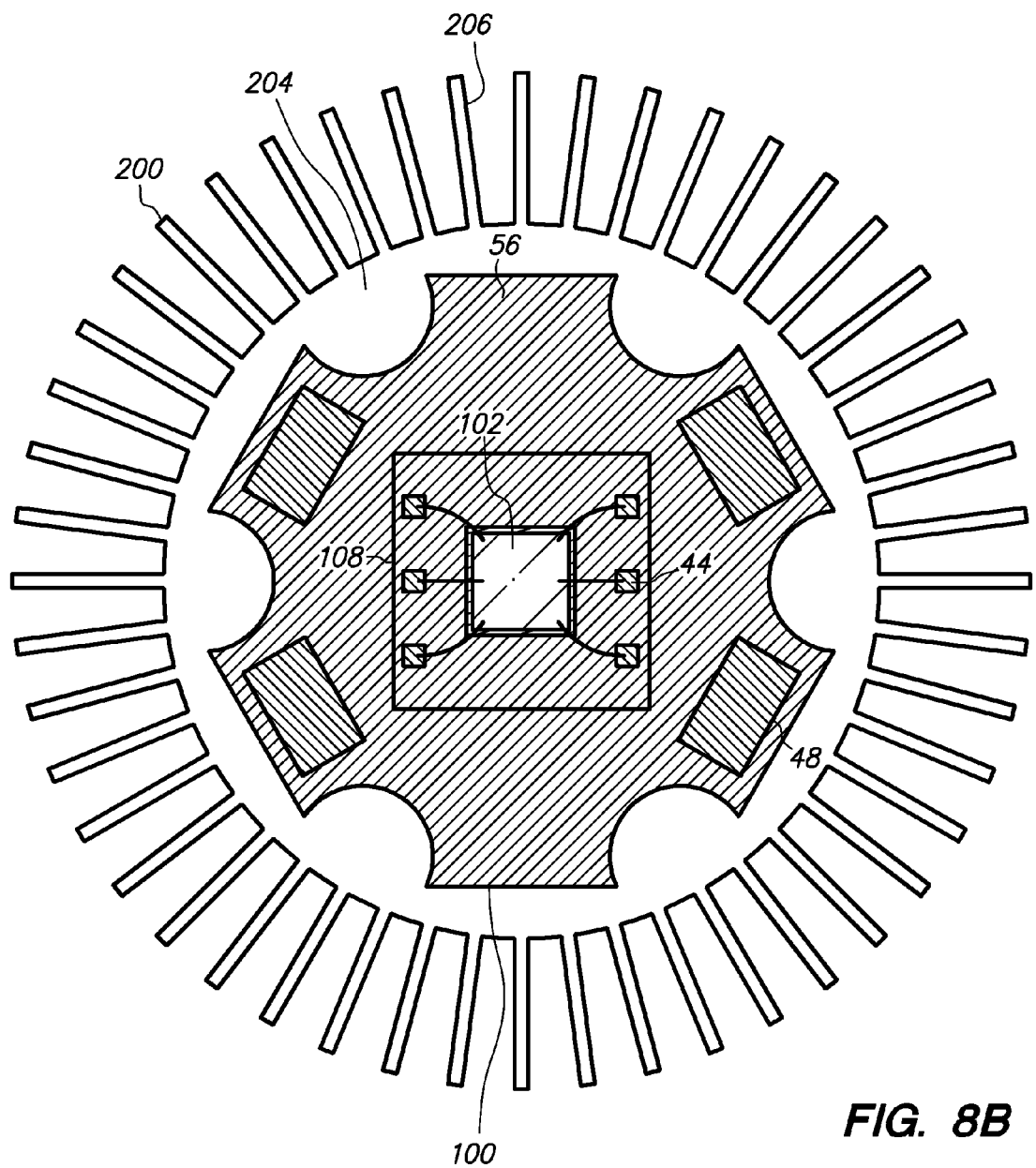
Figure 8C:
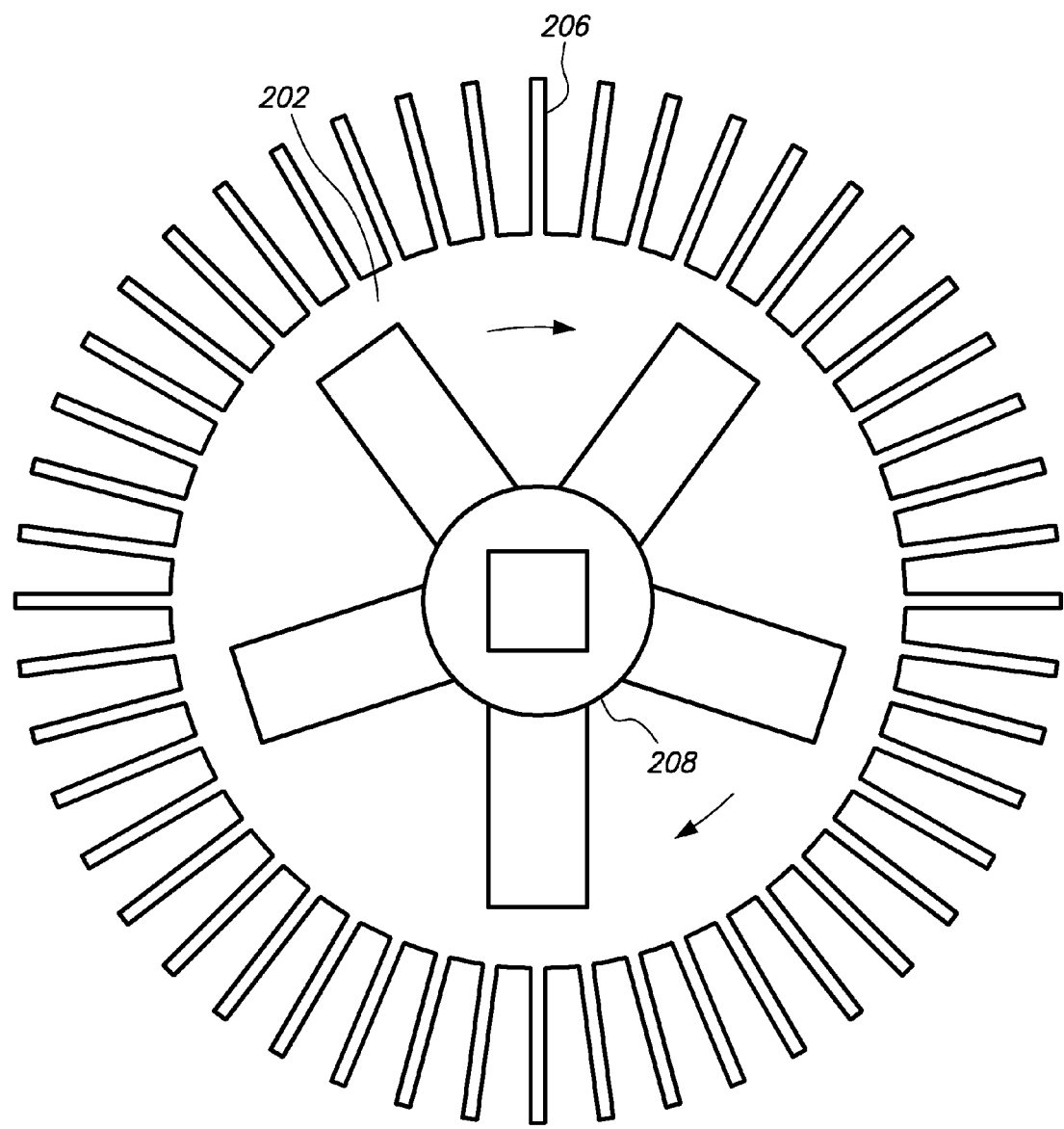

FIGS. 8A, 8B and 8C are cross-sectional, top and bottom views, respectively, of a light source subassembly that includes a semiconductor chip assembly and a heat sink in accordance with an embodiment of the present invention. In this embodiment, the chip is an LED.

Light source subassembly 200 includes semiconductor chip assembly 100 and heat sink 202. Heat sink 202 includes thermal contact surface 204, fins 206 and fan 208. Assembly 100 is mounted on heat sink 202 and mechanically fastened to heat sink 202, for instance by screws (not shown). As a result, base 24 is clamped against and thermally connected to thermal contact surface 204, thereby thermally connecting heat spreader 54 to heat sink 202. Heat spreader 54 spreads the heat from chip 102 and transfers the spread heat to heat sink 202, which in turn dissipates the heat into the exterior environment using fins 206 and fan 208.

Light source subassembly 200 is designed for a light fixture (not shown) that is interchangeable with a standard incandescent light bulb. The light fixture includes subassembly 200, a glass cap, a threaded base, a control board, wiring and a housing. Subassembly 200, the control board and the wiring are enclosed within the housing. The wiring extends from the control board and is soldered to terminals 48. The glass cap and the threaded base protrude from opposite ends of the housing. The glass cap exposes chip 102, the threaded base is configured to screw into a light socket and the control board is electrically connected to terminals 48 by the wiring. The housing is a two-piece plastic shell with top and bottom pieces. The glass cap is attached to and protrudes above the top piece, the threaded base is attached to and protrudes below the bottom piece, and subassembly 200 and the control board are mounted on the bottom piece and extend into the top piece.

During operation, the threaded base transfers AC from a light socket to the control board, which converts the AC to modulated DC and the wiring transmits the modulated DC to terminal 48 and grounds another terminal 48. As a result, chip 102 illuminates bright light through the glass cap. Chip 102 also generates intense localized heat that flows into and is spread by heat spreader 54 and flows from heat spreader 54 into heat sink 202 where fins 206 heat the air, and fan 208 blows the hot air radially outward through slots in the housing into the external environment.

The semiconductor chip assemblies and thermal boards described above are merely exemplary. Numerous other embodiments are contemplated. In addition, the embodiments described above can be mixed-and-matched with one another and with other embodiments depending on design and reliability considerations. For instance, the semiconductor device can be an LED package and the thermal board can provide vertical signal routing. The substrate can include single-level conductive traces and multi-level conductive traces. The thermal board can include multiple posts arranged in an array for multiple semiconductor devices and can include additional conductive traces to accommodate the additional semiconductor devices. Likewise, the semiconductor device can be an LED package with multiple LED chips and the thermal board can include additional conductive traces to accommodate the additional LED chips. The semiconductor device can overlap the substrate and cover the post, the aperture and the opening in the upward direction.

The semiconductor device can share or not share the heat spreader with other semiconductor devices. For instance, a single semiconductor device can be mounted on the heat spreader. Alternatively, numerous semiconductor devices can mounted on the heat spreader. For instance, four small chips in a 2×2 array can be attached to the post and the substrate can include additional conductive traces to receive and route additional wire bonds to the chips. This may be more cost effective than providing a miniature post for each chip.

The semiconductor chip can be optical or non-optical. For instance, the chip can be an LED, a solar cell, a microprocessor, a controller or an RF power amplifier. Likewise, the semiconductor package can be an LED package or an RF module. Thus, the semiconductor device can be a packaged or unpackaged optical or non-optical chip. Furthermore, the semiconductor device can be mechanically, electrically and thermally connected to the thermal board using a wide variety of connection media including solder and electrically and/or thermally conductive adhesive.

The heat spreader can provide rapid, efficient and essentially uniform heat spreading and dissipation for the semiconductor device to the next level assembly without heat flow through the adhesive, the substrate or elsewhere in the thermal board. As a result, the adhesive can have low thermal conductivity which drastically reduces cost. The heat spreader can include a post and base that are integral with one another, thereby enhancing reliability and reducing cost. Furthermore, the post can be customized for the semiconductor device and the base can be customized for the next level assembly, thereby enhancing the thermal connection from the semiconductor device to the next level assembly. For instance, if the opening and the aperture are punched rather than drilled then the post can have a square or rectangular shape in a lateral plane with the same or similar topography as the thermal contact of the semiconductor device.

The heat spreader can be electrically connected to or isolated from the semiconductor device and the substrate. For instance, the die attach can be electrically conductive. Thereafter, the heat spreader can be electrically connected to ground, thereby electrically connecting the semiconductor device to ground.

The post can be deposited on or integral with the base. The post can be integral with the base when they are single-piece aluminum.

The post can include a flat top surface that is coplanar with the adhesive and/or the copper core. For instance, the post can be coplanar with the adhesive and the copper core or the post can be etched after the adhesive is solidified to provide a cavity in the adhesive over the post. The post can also be selectively etched to provide a cavity in the post that extends below its top surface. In any case, the semiconductor device can be mounted on the post and located in the cavity, and the wire bond can extend from the semiconductor device in the cavity to the pad outside the cavity. In this instance, the semiconductor device can be an LED chip and the cavity can focus the LED light in the upward direction.

The base can provide mechanical support for the substrate. For instance, the base can prevent the substrate from warping during metal grinding, chip mounting, wire bonding and encapsulant molding. The base can also cover the assembly in the downward direction when the terminal is above the dielectric layer, or alternatively, be spaced from the peripheral edges of the assembly when the terminal is below the adhesive. Furthermore, the base can include fins at its backside that protrude in the downward direction. For instance, the base can be cut at its bottom surface by a routing machine to form lateral grooves that define the fins. In this instance, the base can have a thickness of 700 microns, the grooves can have a depth of 500 microns and the fins can have a height of 500 microns. The fins can increase the surface area of the base, thereby increasing the thermal conductivity of the base by thermal convection when it remains exposed to the air rather than mounted on a heat sink.

The adhesive can provide a robust mechanical bond between the heat spreader and the substrate. For instance, the adhesive can extend laterally from the post beyond the conductive trace to the peripheral edges of the assembly, the adhesive can fill the space between the heat spreader and the substrate, the adhesive can be located in this space and the adhesive can be void-free with consistent bond lines. The adhesive can also absorb thermal expansion mismatch between the heat spreader and the substrate. Furthermore, the adhesive can be a low cost dielectric that need not have high thermal conductivity. Moreover, the adhesive is not prone to delamination.

The adhesive thickness can be adjusted so that the adhesive essentially fills the gap and essentially all the adhesive is within structure once it is solidified and/or grinded. For instance, the optimal prepreg thickness can be established through trial and error. Likewise, the dielectric layer thickness can be adjusted to achieve this result.

The substrate can be a low cost laminated structure that need not have high thermal conductivity. Furthermore, the substrate can include a single copper layer or multiple copper layers. Moreover, the substrate can include or consist of the copper layer.

The copper layer alone can be mounted on the adhesive. For instance, the aperture can be formed in the copper layer and then the copper layer can be mounted on the adhesive so that the copper layer contacts the adhesive and is exposed in the upward direction and the post extends into and is exposed in the upward direction by the aperture. In this instance, the copper layer can have a thickness of 100 to 200 microns such as 125 microns which is thick enough to handle without warping and wobbling yet thin enough to pattern without excessive etching.

The copper layer and the dielectric layer can be mounted on the adhesive. For instance, the copper layer can be provided on the dielectric layer, then the aperture can be formed in the copper and the dielectric layer, and then the copper layer and the dielectric layer can be mounted on the adhesive so that the copper layer is exposed in the upward direction, the dielectric layer contacts and is sandwiched between and separates the copper layer and the adhesive and the post extends into and is exposed in the upward direction by the aperture. In this instance, the copper layer can have a thickness of 10 to 50 microns such as 30 microns which is thick enough for reliable signal transfer yet thin enough to reduce weight and cost. Furthermore, the dielectric layer is a permanent part of the thermal board.

The copper layer and a carrier can be mounted on the adhesive. For instance, the copper layer can be attached to a carrier such biaxially-oriented polyethylene terephthalate polyester (Mylar) by a thin film, then the aperture can be formed in the copper layer but not the carrier, then the copper layer and the carrier can be mounted on the adhesive so that the carrier covers the copper layer and is exposed in the upward direction, the thin film contacts and is sandwiched between the carrier and the copper layer, the copper layer contacts and is sandwiched between the thin film and the adhesive, and the post is aligned with the aperture and covered in the upward direction by the carrier. After the adhesive is solidified, the thin film can be decomposed by UV light so that the carrier can be peeled off the copper layer, thereby exposing the copper layer in the upward direction, and then the copper layer can be patterned to provide the copper core. In this instance, the copper layer can have a thickness of 10 to 50 microns such as 30 microns which is thick enough for reliable signal transfer yet thin enough to reduce weight and cost, and the carrier can have a thickness of 300 to 500 microns which is thick enough to handle without warping and wobbling yet thin enough to reduce weight and cost. Furthermore, the carrier is a temporary fixture and not a permanent part of the thermal board.

The pad and the terminal can have a wide variety of packaging formats as required by the semiconductor device and the next level assembly.

The pad, the terminal and the routing line over the dielectric layer can be formed by numerous deposition techniques including electroplating, electroless plating, evaporating and sputtering, either before or after the substrate is mounted on the adhesive. For instance, the copper layer can be patterned on the substrate before it is mounted on the adhesive or after it is attached to the post and the base by the adhesive.

The silver coating surface finish can be formed before or after the pad and the terminal are formed. For instance, the silver coating can be deposited on the copper layer and then patterned using the etch mask that defines the pad and the terminal.

The conductive trace can include additional pads, terminals, vias and routing lines as well as passive components and have different configurations. The conductive trace can function as a signal, power or ground layer depending on the purpose of the corresponding semiconductor device pad. The conductive trace can also include various conductive metals such as copper, gold, nickel, silver, palladium, tin, combinations thereof, and alloys thereof. The preferred composition will depend on the nature of the external connection media as well as design and reliability considerations.

Those skilled in the art will understand that in the context of a semiconductor chip assembly, the copper material can be pure elemental copper but is typically a copper alloy that is mostly copper such as copper-zirconium (99.9% copper), copper-silver-phosphorus-magnesium (99.7% copper) and copper-tin-iron-phosphorus (99.7% copper) to improve mechanical properties such as tensile strength and elongation.

Those skilled in the art will also understand that in the context of a semiconductor chip assembly, the aluminum material can be pure elemental aluminum but is typically an aluminum alloy that is mostly aluminum such as aluminum alloy 5052 (aluminum (~97%), magnesium (2.2-2.8%) and other trace elements such as silicon, iron, chromium or copper (<0.5%)) and aluminum alloy 6061 (aluminum (~97%), magnesium (0.18-1.2%), silicon (0.5-0.8%) and other trace elements such as iron, copper, titanium or magnesium (<0.5%)).

The dielectric layer and the solder mask are generally desirable but may be omitted in some embodiments. For instance, if single-level signal routing is used then the dielectric layer may be omitted to reduce cost.

The assembly can provide horizontal or vertical single-level or multi-level signal routing.

Horizontal single-level signal routing with the pad, the terminal and the routing line above the dielectric layer is disclosed in U.S. application Ser. No. 12/616,773 filed Nov. 11, 2009 by Charles W. C. Lin et al. entitled "Semiconductor Chip Assembly with Post/Base Heat Spreader and Substrate" which is incorporated by reference.

Horizontal single-level signal routing with the pad, the terminal and the routing line above the adhesive and no dielectric layer is disclosed in U.S. application Ser. No. 12/616,775 filed Nov. 11, 2009 by Charles W. C. Lin et al. entitled "Semiconductor Chip Assembly with Post/Base Heat Spreader and Conductive Trace" which is incorporated by reference.

Horizontal multi-level signal routing with the pad and the terminal above the dielectric layer electrically connected by first and second vias through the dielectric layer and a routing line beneath the dielectric layer is disclosed in U.S. application Ser. No. 12/557,540 filed Sep. 11, 2009 by Chia-Chung Wang et al. entitled "Semiconductor Chip Assembly with Post/Base Heat Spreader and Horizontal Signal Routing" which is incorporated by reference.

Vertical multi-level signal routing with the pad above the dielectric layer and the terminal beneath the adhesive electrically connected by a first via through the dielectric layer, a routing line beneath the dielectric layer and a second via through the adhesive is disclosed in U.S. application Ser. No. 12/557,541 filed Sep. 11, 2009 by Chia-Chung Wang et al. entitled "Semiconductor Chip Assembly with Post/Base Heat Spreader and Vertical Signal Routing" which is incorporated by reference.

The working format for the thermal board can be a single thermal board or multiple thermal boards based on the manufacturing design. For instance, a single thermal board can be manufactured individually. Alternatively, numerous thermal boards can be simultaneously batch manufactured using a single aluminum plate, a single adhesive, a single substrate and a single solder mask and then separated from one another Likewise, numerous sets of heat spreaders and conductive traces that are each dedicated to a single semiconductor device can be simultaneously batch manufactured for each thermal board in the batch using a single aluminum plate, a single adhesive, a single substrate and a single solder mask.

For example, multiple recesses can be etched in the aluminum plate to form multiple posts and the base, then the non-solidified adhesive with openings corresponding to the posts can be mounted on the base such that each post extends through an opening, then the substrate (with a single copper layer, a single dielectric layer and apertures corresponding to the posts) can be mounted on the adhesive such that each post extends through an opening into an aperture, then the base and the substrate can be moved towards one another by platens to force the adhesive into the gaps in the apertures between the posts and the substrate, then the adhesive can be cured and solidified, then the posts, the adhesive and the copper layer can be grinded to form a lateral top surface, then the copper layer can be etched to form the pads and the terminals corresponding to the posts, then the solder mask can be deposited on the structure and patterned to expose the pads, the terminals and the post, then the silver coating surface finish can be formed on the pads and the terminals and then the base, the substrate, the adhesive and the solder mask can be cut or cracked at the desired locations of the peripheral edges of the thermal boards, thereby separating the individual thermal boards from one another.

The working format for the semiconductor chip assembly can be a single assembly or multiple assemblies based on the manufacturing design. For instance, a single assembly can be manufactured individually. Alternatively, numerous assemblies can be simultaneously batch manufactured before the thermal boards are separated from one another. Likewise, multiple semiconductor devices can be electrically, thermally and mechanically connected to each thermal board in the batch.

For example, die attach paste portions can be deposited on the posts, then the chips can be placed on the die attach paste portions, then the die attach paste portions can be simultaneously heated and hardened to provide the die attaches, then the chips can be wired bonded to the corresponding pads, then the encapsulants can be simultaneously transfer molded on the chips and the wire bonds and then the thermal boards can be separated from one another.

The thermal boards can be detached from one another in a single step or multiple steps. For instance, the thermal boards can be batch manufactured as a panel, then the semiconductor devices can be mounted on the panel and then the semiconductor chip assemblies of the panel can be detached from one another. Alternatively, the thermal boards can be batch manufactured as a panel, then the thermal boards of the panel can be singulated into strips of multiple thermal boards, then the semiconductor devices can be mounted on the thermal boards of a strip and then the semiconductor chip assemblies of the strip can be detached from one another. Furthermore, the thermal boards can be detached by mechanical sawing, laser sawing, cleaving or other suitable techniques.

The term "adjacent" refers to elements that are integral (single-piece) or in contact (not spaced or separated from) with one another. For instance, the post is adjacent to the base regardless of whether the post is formed additively or subtractively.

The term "overlap" refers to above and extending within a periphery of an underlying element. Overlap includes extending inside and outside the periphery or residing within the periphery. For instance, the semiconductor device overlaps the post since an imaginary vertical line intersects the semiconductor device and the post, regardless of whether another element such as the die attach is between the semiconductor device and the post and is intersected by the line, and regardless of whether another imaginary vertical line intersects the semiconductor device but not the post (outside the periphery of the post) Likewise, the adhesive overlaps the base and is overlapped by the pad, and the base is overlapped by the post Likewise, the post overlaps and is within a periphery of the base. Moreover, overlap is synonymous with over and overlapped by is synonymous with under or beneath.

The term "contact" refers to direct contact. For instance, the dielectric layer contacts the pad but does not contact the post or the base.

The term "cover" refers to complete coverage in the upward, downward and/or lateral directions. For instance, the base covers the post in the downward direction but the post does not cover the base in the upward direction.

The term "layer" refers to patterned and unpatterned layers. For instance, the conductive layer can be an unpatterned blanket copper sheet on the dielectric layer when the substrate is mounted on the adhesive, and the conductive layer can be a patterned circuit with spaced silver-coated copper traces on the dielectric layer when the semiconductor device is mounted on the heat spreader. Furthermore, a layer can include stacked layers.

The term "pad" in conjunction with the conductive trace refers to a connection region that is adapted to contact and/or bond to external connection media (such as solder or a wire bond) that electrically connects the conductive trace to the semiconductor device.

The term "terminal" in conjunction with the conductive trace refers to a connection region that is adapted to contact and/or bond to external connection media (such as solder or a wire bond) that electrically connects the conductive trace to an external device (such as a PCB or a wire thereto) associated with the next level assembly.

The terms "opening" and "aperture" refer to a through-hole and are synonymous. For instance, the post is exposed by the adhesive in the upward direction when it is inserted into the opening in the adhesive. Likewise, the post is exposed by the substrate in the upward direction when it is inserted into the aperture in the substrate.

The term "inserted" refers to relative motion between elements. For instance, the post is inserted into the aperture regardless of whether the post is stationary and the substrate moves towards the base, the substrate is stationary and the post moves towards the substrate or the post and the substrate both approach the other. Furthermore, the post is inserted (or extends) into the aperture regardless of whether it goes through (enters and exits) or does not go through (enters without exiting) the aperture.

The phrase "move towards one another" also refers to relative motion between elements. For instance, the base and the substrate move towards one another regardless of whether the base is stationary and the substrate moves towards the base, the substrate is stationary and the base moves towards the substrate or the base and the substrate both approach the other.

The phrase "aligned with" refers to relative position between elements. For instance, the post is aligned with the aperture when the adhesive is mounted on the base, the substrate is mounted on the adhesive, the post is inserted into and aligned with the opening and the aperture is aligned with the opening regardless of whether the post is inserted into the aperture or is below and spaced from the aperture.

The phrase "mounted on" includes contact and non-contact with a single or multiple support element(s). For instance, the semiconductor device is mounted on the heat spreader regardless of whether it contacts the heat spreader or is separated from the heat spreader by a die attach. Likewise, the semiconductor device is mounted on the heat spreader regardless of whether it is mounted on the heat spreader alone or the heat spreader and the substrate.

The phrase "adhesive . . . in the gap" refers to the adhesive in the gap. For instance, adhesive that extends across the dielectric layer in the gap refers to the adhesive in the gap that extends across the dielectric layer. Likewise, adhesive that contacts and is sandwiched between the post and the dielectric layer in the gap refers to the adhesive in the gap that contacts and is sandwiched between the post at the inner sidewall of the gap and the dielectric layer at the outer sidewall of the gap.

The term "above" refers to upward extension and includes adjacent and non-adjacent elements as well as overlapping and non-overlapping elements. For instance, the post extends above, is adjacent to, overlaps and protrudes from the base. Likewise, the post extends above the dielectric layer even though it is not adjacent to or overlap the dielectric layer.

The term "below" refers to downward extension and includes adjacent and non-adjacent elements as well as overlapping and non-overlapping elements. For instance, the base extends below, is adjacent to, is overlapped by and protrudes from the post. Likewise, the post extends below the dielectric layer even though it is not adjacent to or overlapped by the dielectric layer.

The "upward" and "downward" vertical directions do not depend on the orientation of the semiconductor chip assembly (or the thermal board), as will be readily apparent to those skilled in the art. For instance, the post extends vertically above the base in the upward direction and the adhesive extends vertically below the pad in the downward direction regardless of whether the assembly is inverted and/or mounted on a heat sink Likewise, the base extends "laterally" from the post in a lateral plane regardless of whether the assembly is inverted, rotated or slanted. Thus, the upward and downward directions are opposite one another and orthogonal to the lateral directions, and laterally aligned elements are coplanar with one another at a lateral plane orthogonal to the upward and downward directions.

The semiconductor chip assembly of the present invention has numerous advantages. The assembly is reliable, inexpensive and well-suited for high volume manufacture. The assembly is especially well-suited for high power semiconductor devices such as LED packages and large semiconductor chips as well as multiple semiconductor devices such as small semiconductor chips in arrays which generate considerable heat and require excellent heat dissipation in order to operate effectively and reliably.

The manufacturing process is highly versatile and permits a wide variety of mature electrical, thermal and mechanical connection technologies to be used in a unique and improved manner. The manufacturing process can also be performed without expensive tooling. As a result, the manufacturing process significantly enhances throughput, yield, performance and cost effectiveness compared to conventional packaging techniques. Moreover, the assembly is well-suited for copper chip and lead-free environmental requirements.

The embodiments described herein are exemplary and may simplify or omit elements or steps well-known to those skilled in the art to prevent obscuring the present invention. Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

We claim:

1. A method of making a semiconductor chip assembly, comprising:
    providing a post, a base, an adhesive and a copper layer, wherein
        the post is adjacent to the base, extends above the base in an upward direction, extends into an opening in the adhesive, is aligned with an aperture in the copper layer and is aluminum,
        the base extends below the post in a downward direction opposite the upward direction, extends laterally from the post in lateral directions orthogonal to the upward and downward directions and is aluminum,
        the adhesive is mounted on and extends above the base, is sandwiched between the base and the copper layer and is non-solidified, and
        the copper layer is mounted on and extends above the adhesive; then
    flowing the adhesive into and upward in a gap located in the aperture between the post and the copper layer;
    solidifying the adhesive; then
    providing a conductive trace that includes a pad and a terminal, wherein the conductive trace further includes a silver coating and a copper core, the silver coating is located above and overlaps the copper core, and the copper core is a selected portion of the copper layer that is coplanar with the post and the adhesive at a lateral surface that includes the post, the adhesive and the copper core and faces in the upward direction; then
    mounting a semiconductor device on the post, wherein an aluminum heat spreader includes the post and the base and the semiconductor device is mounted on and overlaps the post;
    electrically connecting the semiconductor device to the pad, thereby electrically connecting the semiconductor device to the terminal; and
    thermally connecting the semiconductor device to the post, thereby thermally connecting the semiconductor device to the base.

2. The method of claim 1, wherein providing the post and the base includes:
    providing an aluminum plate;
    forming an etch mask on the aluminum plate that selectively exposes the aluminum plate;
    etching the aluminum plate in a pattern defined by the etch mask, thereby forming a recess in the aluminum plate that extends into but not through the aluminum plate; and then
    removing the etch mask, wherein the post includes an unetched portion of the aluminum plate that protrudes above the base and is laterally surrounded by the recess, and the base includes an unetched portion of the aluminum plate below the post and the recess.

3. The method of claim 1, wherein:
    providing the adhesive includes providing a prepreg with uncured epoxy;
    flowing the adhesive includes melting the uncured epoxy and compressing the uncured epoxy between the base and the copper layer; and
    solidifying the adhesive includes curing the uncured epoxy.

4. The method of claim 1, wherein flowing the adhesive includes filling the gap with the adhesive.

5. The method of claim 1, wherein mounting the copper layer includes mounting the copper layer alone on the adhesive.

6. The method of claim 1, wherein mounting the copper layer includes mounting the copper layer and a dielectric layer on the adhesive.

7. The method of claim 1, wherein providing the pad includes removing selected portions of the copper layer after solidifying the adhesive.

8. The method of claim wherein providing the pad and the terminal includes removing selected portions of the copper layer after solidifying the adhesive.

9. The method of claim 1, wherein providing the conductive trace includes:
 grinding the post, the adhesive and the copper layer such that the post, the adhesive and the copper layer are laterally aligned with one another at a top lateral surface that faces in the upward direction; then
 removing selected portions of the copper layer using an etch mask that defines the pad, thereby forming the copper core; and then
 plating the silver coating over the copper core, thereby forming the pad.

10. The method of claim 1, wherein mounting the semiconductor device includes providing a die attach between the semiconductor device and the post, electrically connecting the semiconductor device includes providing a wire bond between the semiconductor device and the pad, and thermally connecting the semiconductor device includes providing the die attach between the semiconductor device and the post.

11. A method of making a semiconductor chip assembly, comprising:
 providing a post and a base, wherein the post is adjacent to and integral with the base and extends above the base in an upward direction, the base extends below the post in a downward direction opposite the upward direction and extends laterally from the post in lateral directions orthogonal to the upward and downward directions and the post and the base are aluminum;
 providing an adhesive, wherein an opening extends through the adhesive;
 providing a copper layer, wherein an aperture extends through the copper layer;
 mounting the adhesive on the base, including inserting the post into the opening, wherein the adhesive extends above the base and the post extends into the opening;
 mounting the copper layer on the adhesive, including aligning the post with the aperture, wherein the copper layer extends above the adhesive and the adhesive is sandwiched between the base and the copper layer and is non-solidified; then
 applying heat to melt the adhesive;
 moving the base and the copper layer towards one another, thereby moving the post upward in the aperture and applying pressure to the molten adhesive between the base and the copper layer, wherein the pressure forces the molten adhesive to flow into and upward in a gap located in the aperture between the post and the copper layer;
 applying heat to solidify the molten adhesive, thereby mechanically attaching the post and the base to the copper layer; then
 providing a conductive trace that includes a pad and a terminal, wherein the conductive trace further includes a silver coating and a copper core, the silver coating is located above and overlaps the copper core, the copper core is a selected portion of the copper layer that is coplanar with the post and the adhesive at a lateral surface that faces in the upward direction, the silver coating and the copper core provide portions of the pad and the pad is electrically connected to the terminal; then
 mounting a semiconductor device on the post, wherein an aluminum heat spreader includes the post and the base and the semiconductor device overlaps the post;
 electrically connecting the semiconductor device to the pad, thereby electrically connecting the semiconductor device to the terminal; and
 thermally connecting the semiconductor device to the post, thereby thermally connecting the semiconductor device to the base.

12. The method of claim 11, wherein providing the post and the base includes:
 providing an aluminum plate;
 forming an etch mask on the aluminum plate that selectively exposes the aluminum plate;
 etching the aluminum plate in a pattern defined by the etch mask, thereby forming a recess in the aluminum plate that extends into but not through the aluminum plate; and then
 removing the etch mask, wherein the post includes an unetched portion of the aluminum plate that protrudes above the base and is laterally surrounded by the recess, and the base includes an unetched portion of the aluminum plate below the post and the recess.

13. The method of claim 11, wherein:
 providing the adhesive includes providing a prepreg with uncured epoxy;
 flowing the adhesive includes melting the uncured epoxy and compressing the uncured epoxy between the base and the copper layer; and
 solidifying the adhesive includes curing the uncured epoxy.

14. The method of claim 11, wherein mounting the copper layer includes mounting the copper layer alone on the adhesive.

15. The method of claim 11, wherein mounting the copper layer includes mounting the copper layer and a dielectric layer on the adhesive.

16. The method of claim 11, wherein providing the pad includes:
 removing selected portions of the copper layer using an etch mask that defines the pad, thereby forming the copper core; and then
 plating the silver coating over the copper core, thereby forming the pad.

17. The method of claim 11, wherein providing the pad includes:
 grinding the post, the adhesive and the copper layer such that the post, the adhesive and the copper layer are laterally aligned with one another at a top lateral surface that faces in the upward direction; then
 removing selected portions of the copper layer using an etch mask that defines the pad, thereby forming the copper core; and then
 plating the silver coating over the copper core, thereby forming the pad.

18. The method of claim 17, wherein plating the silver coating includes plating the silver coating on the copper core.

19. The method of claim 17, wherein plating the silver coating includes:
 plating a nickel buffer layer on the copper core; and
 plating the silver coating on the nickel buffer layer.

20. The method of claim 11, wherein mounting the semiconductor device includes providing a die attach between the semiconductor device and the post, electrically connecting the semiconductor device includes providing a wire bond between the semiconductor device and the pad, and thermally connecting the semiconductor device includes providing the die attach between the semiconductor device and the post.

21. A method of making a semiconductor chip assembly, comprising:
providing a post, a base, an adhesive and a substrate, wherein
the substrate includes a copper layer and a dielectric layer,
the post is adjacent to the base, extends above the base in an upward direction, extends through an opening in the adhesive, extends into an aperture in the substrate and is aluminum,
the base extends below the post in a downward direction opposite the upward direction, extends laterally from the post in lateral directions orthogonal to the upward and downward directions and is aluminum,
the adhesive is mounted on and extends above the base, is sandwiched between the base and the substrate and is non-solidified,
the substrate is mounted on and extends above the adhesive, and the copper layer extends above the dielectric layer, and
a gap is located in the aperture between the post and the substrate; then
flowing the adhesive into and upward in the gap;
solidifying the adhesive; then
mounting a semiconductor device on the post, wherein an aluminum heat spreader includes the post and the base, the semiconductor device overlaps the post, a conductive trace includes a pad and a terminal and further includes a silver coating and a copper core, the silver coating is located above and overlaps the copper core, the copper core is a selected portion of the copper layer that is coplanar with the post and the adhesive at a lateral surface that faces in the upward direction, the silver coating and the copper core provide portions of the pad and the pad is electrically connected to the terminal;
electrically connecting the semiconductor device to the pad, thereby electrically connecting the semiconductor device to the terminal; and
thermally connecting the semiconductor device to the post, thereby thermally connecting the semiconductor device to the base.

22. The method of claim 21, wherein providing the post and the base includes:
providing an aluminum plate;
forming an etch mask on the aluminum plate that selectively exposes the aluminum plate;
etching the aluminum plate in a pattern defined by the etch mask, thereby forming a recess in the aluminum plate that extends into but not through the aluminum plate; and then
removing the etch mask, wherein the post includes an unetched portion of the aluminum plate that protrudes above the base and is laterally surrounded by the recess, and the base includes an unetched portion of the aluminum plate below the post and the recess.

23. The method of claim 21, wherein:
providing the adhesive includes providing a prepreg with uncured epoxy;
flowing the adhesive includes melting the uncured epoxy and compressing the uncured epoxy between the base and the substrate; and
solidifying the adhesive includes curing the uncured epoxy.

24. The method of claim 21, wherein flowing the adhesive includes filling the gap with the adhesive.

25. The method of claim 21, wherein providing the pad includes:
removing selected portions of the copper layer after solidifying the adhesive, thereby forming the copper core; and then
plating the silver coating over the copper core, thereby forming the pad.

26. The method of claim 21, wherein providing the pad and the terminal includes:
removing selected portions of the copper layer after solidifying the adhesive, thereby forming the copper core; and then
plating the silver coating over the copper core, thereby forming the pad and the terminal.

27. The method of claim 21, wherein providing the pad and the terminal includes:
grinding the post, the adhesive and the copper layer such that the post, the adhesive and the copper layer are laterally aligned with one another at a top lateral surface that faces in the upward direction; then
removing selected portions of the copper layer using an etch mask that defines the pad and the terminal, thereby forming the copper core; and then
plating the silver coating over the copper core, thereby forming the pad and the terminal.

28. The method of claim 21, wherein providing the terminal includes removing selected portions of the base after solidifying the adhesive.

29. The method of claim 21, wherein providing the conductive trace includes:
grinding the post, the adhesive and the copper layer such that the post, the adhesive and the copper layer are laterally aligned with one another at a top lateral surface that faces in the upward direction; then
removing selected portions of the copper layer using an etch mask that defines the pad, thereby forming the copper core; and then
plating the silver coating over the copper core, thereby forming the pad.

30. The method of claim 21, wherein mounting the semiconductor device includes mounting an LED chip on the post using a die attach, electrically connecting the semiconductor device includes providing a wire bond between the LED chip and the pad, and thermally connecting the semiconductor device includes providing the die attach between the LED chip and the post.

31. A method of making a semiconductor chip assembly, comprising:
providing a post and a base, wherein the post is adjacent to and integral with the base and extends above the base in an upward direction, the base extends below the post in a downward direction opposite the upward direction and extends laterally from the post in lateral directions orthogonal to the upward and downward directions and the post and the base are aluminum;
providing an adhesive, wherein an opening extends through the adhesive;
providing a substrate that includes a copper layer and a dielectric layer, wherein an aperture extends through the substrate;
mounting the adhesive on the base, including inserting the post through the opening, wherein the adhesive extends above the base and the post extends through the opening;

mounting the substrate on the adhesive, including inserting the post into the aperture, wherein the substrate extends above the adhesive, the copper layer extends above the dielectric layer, the post extends through the opening into the aperture, the adhesive is sandwiched between the base and the substrate and is non-solidified, and a gap is located in the aperture between the post and the substrate; then applying heat to melt the adhesive;

moving the base and the substrate towards one another, thereby moving the post upward in the aperture and applying pressure to the molten adhesive between the base and the substrate, wherein the pressure forces the molten adhesive to flow into and upward in the gap and the post and the molten adhesive extend above the dielectric layer;

applying heat to solidify the molten adhesive, thereby mechanically attaching the post and the base to the substrate; then mounting a semiconductor device on the post, wherein an aluminum heat spreader includes the post and the base, the semiconductor device overlaps the post, a conductive trace includes a pad and a terminal and further includes a silver coating and a copper core, the silver coating is located above and overlaps the copper core, the copper core is a selected portion of the copper layer that is coplanar with the post and the adhesive at a lateral surface that faces in the upward direction, the silver coating and the copper core provide portions of the pad and the pad is electrically connected to the terminal;

electrically connecting the semiconductor device to the pad, thereby electrically connecting the semiconductor device to the terminal; and thermally connecting the semiconductor device to the post, thereby thermally connecting the semiconductor device to the base.

32. The method of claim 31, wherein providing the post and the base includes:
providing an aluminum plate;

forming an etch mask on the aluminum plate that selectively exposes the aluminum plate;

etching the aluminum plate in a pattern defined by the etch mask, thereby forming a recess in the aluminum plate that extends into but not through the aluminum plate; and then removing the etch mask, wherein the post includes an unetched portion of the aluminum plate that protrudes above the base and is laterally surrounded by the recess, and the base includes an unetched portion of the aluminum plate below the post and the recess.

33. The method of claim 31, wherein:
providing the adhesive includes providing a prepreg with uncured epoxy;
flowing the adhesive includes melting the uncured epoxy and compressing the uncured epoxy between the base and the substrate; and
solidifying the adhesive includes curing the uncured epoxy.

34. The method of claim 31, wherein providing the pad and the terminal includes:
removing selected portions of the copper layer using an etch mask that defines the pad and the terminal after solidifying the adhesive, thereby forming the copper core; and then
plating the silver coating over the copper core, thereby forming the pad and the terminal.

35. The method of claim 31, wherein providing the pad and the terminal includes:
grinding the post, the adhesive and the copper layer such that the post, the adhesive and the copper layer are laterally aligned with one another at a top lateral surface that faces in the upward direction; then
removing selected portions of the copper layer using an etch mask that defines the pad and the terminal, thereby forming the copper core; and then
plating the silver coating over the copper core, thereby forming the pad and the terminal.

* * * * *